(12) United States Patent
Takaoka et al.

(10) Patent No.: US 6,477,475 B1
(45) Date of Patent: Nov. 5, 2002

(54) FAULT POINT LOCATION SYSTEM

(75) Inventors: Motokuni Takaoka, 82-1, 1-chome, Mikanyama-cho, Mizuho-ku, Nagoya (JP); Masanori Sugiura, Obu (JP)

(73) Assignees: Nippon Kouatsu Electric Co., Ltd., Nagoya (JP); Motokuni Takaoka, Nagoya (JP)

( * ) Notice: Subject to any disclaimer, the term of this patent is extended or adjusted under 35 U.S.C. 154(b) by 0 days.

(21) Appl. No.: 09/436,237

(22) Filed: Nov. 9, 1999

(30) Foreign Application Priority Data

Nov. 12, 1998 (JP) ............................. 10-322498
Dec. 28, 1998 (JP) ............................. 10-373661

(51) Int. Cl.$^7$ ............................................. G01R 31/00
(52) U.S. Cl. ...................... 702/59; 324/535; 455/503
(58) Field of Search .................. 702/57, 58, 59; 714/25; 701/213, 214, 215; 324/535; 455/503, 67.3

(56) References Cited

U.S. PATENT DOCUMENTS

| | | | | |
|---|---|---|---|---|
| 5,070,537 A | * | 12/1991 | Ohira et al. | 455/67.3 |
| 5,280,629 A | * | 1/1994 | Lo Galbo et al. | 455/503 |
| 5,440,313 A | * | 8/1995 | Osterdock et al. | 342/353 |
| 5,508,619 A | * | 4/1996 | Ozawa et al. | 324/535 |
| 5,682,100 A | * | 10/1997 | Rossi et al. | 324/535 |
| 5,729,144 A | * | 3/1998 | Cummins | 324/535 |
| 6,259,255 B1 | * | 7/2001 | Ohira et al. | 324/535 |

FOREIGN PATENT DOCUMENTS

| | | |
|---|---|---|
| DE | 296 23 086 U1 | 2/1998 |
| EP | 362 406 A1 | 4/1990 |
| EP | 649 029 A2 | 4/1995 |
| GB | 2 266 419 A | 10/1993 |
| JP | 56-63274 | 5/1981 |
| JP | 63-51274 | 10/1988 |
| JP | 8-15362 | 1/1996 |
| WO | WO 96/22546 | 7/1996 |

* cited by examiner

*Primary Examiner*—Marc S. Hoff
*Assistant Examiner*—Mohamed Charioui
(74) *Attorney, Agent, or Firm*—Morgan, Lewis & Bockius LLP

(57) ABSTRACT

A fault point location system comprising substations 1 to send information of transmission and distribution lines, and the master station 2 to locate fault points under the information. Substation 1 detects a surge detection time and the surge current polarity. Master 2 identifies a no-branch fault section under the polarity, and identifies the fault point under a difference among detection times of substations 1 at both ends of the section, and the section length.

7 Claims, 22 Drawing Sheets

FAULT POINT LOCATION SYSTEM

BACKGROUND OF THE INVENTION

The present invention relates to a fault point location system. More particularly, the present embodiment relates to a fault point location system by which fault points can be quickly located at the time of a fault along a transmission and distribution line. Additionally, the present other embodiments relate to a fault point location system by which fault points can be identified on a map for which a transmission and distribution line map is automatically prepared in response to relocation and extension of the transmission and distribution line.

Heretofore, map information with power transmission lines and distribution lines (hereinafter designated "transmission and distribution line" or "TD line" for both lines) illustrated on a map has been available.

In addition, a method has been developed for locating a fault according to a difference in the time of surge detection at both ends of a straight TD line with no branch in the case where a fault occurs along the line. (Japanese Patent Publication No.Sho 63 (1988)-51274, etc.)

However, said map information with TD lines illustrated on a map has not been updated in real time in response to frequent relocation or extension of actual TD lines. For this reason, in an emergency case, quick action sometimes could not be taken due to a difference between a TD line map and actual TD line.

Moreover, although such a fault point identifying method as disclosed in Japanese Patent Publication No.Sho 63 (1988)-51274, which allowed for identifying the distance along a TD line from both ends thereof, wherein a surge was detected, precise location of the fault for fault recovery could not be determined on a map since the actual TD line was placed in a meandering fashion.

Still moreover, although an approximate point of a fault could be identified on a map according to the distance on the TD line from both ends thereof where a surge was detected even on a winding TD line, an actual TD line is not one line but arranged with a plurality of branches, and therefore, such a fault point identifying method as disclosed in Japanese Patent Publication No.Sho 63 (1988)-51274 cannot be applied as it is for locating fault points.

SUMMARY OF THE INVENTION

An object of the present invention is to provide a fault point location system by which a fault point can be quickly located and identified on a TD line map for solving the above mentioned problems. Another object of the present invention is to provide a fault point location system that allows for automatically preparing a TD line map in response to relocation and extension of TD lines, and locates a fault point on a map in the case of an occurrence of a fault on a TD line.

A fault point location system of a first embodiment is a fault point location system comprising:
- substations 1 installed along TD lines for sending information along said TD lines to a master station 2, and the master station 2 for locating fault points on the basis of the information sent by said substations 1;
- characterized in that
- said substation 1 has a clock function, receives radio waves from a GPS satellite to identify the current time the GPS has, is able to synchronize the current time said GPS has with the self current time, detects a surge current or surge voltage of the TD line along which said substation 1 is installed to identify a surge detection time, the time at which said surge current or surge voltage is detected, recognizes the polarity of said surge current, and then sends said surge detection time and information on said polarity to said master station 2 via a communication network; and
- said master station 2 receives said surge detection time and information on said polarity, which are transmitted from said substation 1 via the communication network,
- identifies a section with no branch as the section of occurrence of a fault on the basis of information on said polarity of each substation 1, and
- identifies the point of occurrence of a fault along the TD line on the basis of a difference in the time of detection of said surge detected by substations 1 at both ends of said fault section, and the length of said fault section along the TD line.

In the foregoing, the "GPS radio waves" are radio waves a satellite emits in the "GPS". Additionally, the "GPS" is an abbreviation for the "Global Positioning System", a system for determining a position on the basis of differences in time when receiving radio waves from a plurality of satellites.

In the foregoing, the "fault section" is a section with no branch that is identified as a section of occurrence of a fault.

A fault point location system of a second embodiment has, in the fault point location system according to embodiment 1:
- said substation 1 comprising a GPS receiving means 11, a time measuring means 12, a surge detection means 13, and a surge information transmitting means 14b, wherein
- said GPS receiving means 11 receives GPS radio waves from satellites for identifying the current time the GPS has to send the current time said GPS has to said time measuring means 12,
- said time measuring means 12 has a clock function for synchronizing the current time said GPS has from said GPS receiving means 11 with the current time of said substation 1 and then sends information on said current time of said substation 1 to the surge detection means 13,
- said surge detection means 13 detects a surge current or surge voltage of a TD line along which said substation 1 is installed, identifies the time of surge detection time at which said surge detection signal is received on the basis of information on the time sent by said time measuring means 12, also recognizes a polarity of said surge current, and transmits said surge detection time and said polarity to said surge information transmitting means 14b, and
- said surge information transmitting means 14b sends said surge detection time and said information on polarity to said master station 2 via a communication network; and
- said master station 2 comprising a substation surge information receiving means 21b, a fault section identifying means 23b, and a fault location identifing means 23c, wherein
- said substation surge information receiving means 21b receives said surge detection time sent by said surge information transmitting means 14b and said information on polarity via a communication network, then sends said information on polarity to said fault section identifying means 23b, and sends said surge detection time to fault location identifying means 23c, said fault section identifying means 23b identifies a section with no branch as a section of occurrence of a fault on the basis of said information on polarity of each substation 1 and sends said section as a fault section to said fault location identifying means 23c, and said fault location identifying means 23c identifies a point of occurrence of a fault along a TD line on the basis of a difference in said surge detection time of substations 1 at both ends of said fault section and the length of the TD line of said fault section.

In the foregoing, assume the "polarity" of a surge current "positive (+)" for ground fault current flowing from a source-side to a load-side and "negative (−)" for ground fault current flowing from the load-side to the source-side.

A fault point location system of a third and a seventh embodiment in the fault point location system according to embodiment 2 or 6, wherein, in accordance with said surge detection time t1 detected at one of the substations at both ends of said fault section, said surge detection time t2 of the other substation, surge propagation velocity v, and length L of the TD line of the section of said fault has occurred, said fault location identifying means determines distance L1 on a TD line from one of the substations to the location of the fault along the TD line is determined by equation $L1=(L+(t1-t2)\times v)/2$.

A fault point location system of a fourth and an eighth embodiment in the fault point location system according to embodiment 3 or 7, allows said fault location identifying means to identify sections of occurrence of a fault through the procedures wherein:

1. Select one TD line that extends from a power source,
2. Compare data of a surge rising polarity of a substation with that of its neighboring substation along said TD line selected,
3. If there is a substation of a polarity opposite to its neighboring substation and the section with the substations located at the ends of the section has no branch, decide that the section is "the section with a fault",
4. If there is a substation of a polarity opposite to its neighboring substation and the section with said substations located at the ends of the section has a branch, compare the surge rising polarity data of the most upstream substation among the substations of the spur TD line with the surge rising polarity data of the upstream substation among substations which have a polarity opposite to their neighboring substation of the trunk TD line,
5. If the polarity of the most upstream substation among the substations of said spur TD line is opposite to the polarity of the upstream substation among substations which have a polarity opposite to their neighboring substation of said trunk TD line, decide that the section ranging from the most upstream substation among the substations of said spur TD line through the upstream substation among substations which have a polarity opposite to their neighboring substation of said trunk TD line to the downstream substation among substations which have a polarity opposite to their neighboring substation of said trunk TD line is a "section of a fault",
6. If the polarity of the most upstream substation among the substations of said spur TD line is the same as the polarity of the upstream substation among substations which have a polarity opposite to their neighboring substation of said trunk TD line, select one TD line out of said spur TD lines to replace said "one TD line selected" with the TD line out of said spur TD lines and perform the procedures from the foregoing 2.

In the foregoing, "to select one TD line" is defined for a TD line with no branch as to select the TD line, and for a TD line with a branch along the line as to select a series of TD lines with no branch out of TD lines with branches along the lines thereof.

In addition, the "spur TD line" is a TD line branched from "one TD line selected". The "trunk TD line" is "one TD line selected". These "spur" and "trunk" indicates, however, only a relative relationship of TD lines to be branched. Accordingly, the "trunk TD line" is not always connected directly to a power station.

Moreover, the "upstream" indicates source-side, while "downstream" indicates load-side.

A fault point location system of a fifth embodiment comprising:

substations 1 which are installed along a TD line to transmit information on said TD line to a master station 2, and a master station 2 which prepares TD line map information on the basis of information from said substations 1 to locate faults;

said fault point location system characterized in that said substation 1 receives GPS radio waves from a satellite for identifying its own position on the basis of said GPS radio waves and then transmits information on said own position to said master station 2 via communication networks, further, said master station 2 receives the information on the position of said substation 1 sent by said substation 1 via communication networks for preparing TD line map information which has TD lines illustrated on a map on the basis of map information on a region where each substation is installed and information on the position of said substations, and then outputs said TD line map information, said substation 1 has a clock function, receives radio waves from a GPS satellite to identify the current time of the GPS, is able to synchronize the current time of said GPS with the self current time, detects a surge current or surge voltage of the TD line along which said substation 1 is installed to identify a surge detection time, the time at which said surge current or surge voltage is detected, recognizes the polarity of said surge current, and then sends said surge detection time and information on said polarity to said master station 2 via a communication network, and said master station 2 receives said surge detection time and information on said polarity, which are transmitted from said substation 1 via the communication network, identifies a section with no branch as the section of an occurrence of a fault on the basis of information on said polarity of each substation 1, identifies the point of an occurrence of a fault along the TD line on the basis of a difference in the time of detection of said surge detected by substations 1 at both ends of said fault section, and the length of said fault section along the TD line, identifies said point of occurrence of a fault along the TD line on a TD line of said TD line map information, re-prepares the TD line map information in consideration of said identified information at the point of occurrence of a fault, and outputs said re-prepared TD line map information.

A fault point location system of a sixth embodiment in the fault point location system, according to embodiment 5, wherein said substation 1 comprises a GPS receiving means 11, a time measuring means 12, a surge detection means 13, a self-position information transmitting means 14a, and a surge information transmitting means 14b;

said master station 2 comprises a substation location information receiving means 21a, a substation surge information receiving means 21b, a map information storage means 22, a TD line map information preparing means 23a, a fault section identifying means 23b, a fault location identifying means 23c, and a TD line map information output means 24;

said GPS receiving means 11 receives GPS radio waves from a satellite for identifying its own position on the basis of said GPS radio waves and then transmits information on said own position to said self-position information transmitting means 14a;

said self-position information transmitting means 14a transmits information on said own position to said master station 2 via communication networks;

said substation location information receiving means 21a receives the information on the position of said substation 1 sent by said self-position information transmitting means 14a via communication networks to transmit the information on the position of said substation 1 to said TD line map information preparing means 23a;

said map information storage means 22 is able to provide map information on a region where each substation is installed for said TD line map information preparing means 23a;

said TD line map information preparing means 23a receives said map information from said map information storage means 22 for preparing TD line map information which has TD lines illustrated on a map on the basis of said map information and the information on the position of said substations which was received from said substation location information receiving means 21a to transmit said TD line map information to said TD line map information output means 24;

said TD line map information output means 24 outputs said TD line map information;

further, said GPS receiving means 11 receives GPS radio waves from a satellite to identify the current time of the GPS and transmits said current time of the GPS to said time measuring means 12;

said time measuring means 12 has a clock function, is able to synchronize the current time said GPS has sent by said GPS receiving means 11 with the self current time, and transmits said self current time information to the surge detection means 13;

said surge detection means 13 detects a surge current or surge voltage of the TD line along which said substation 1 is installed to identify a surge detection time, the time at which said surge current or surge voltage signal is received, on the basis of information on the time from said time measuring means 12, recognizes the polarity of said surge current, and then sends said surge detection time and information on said polarity to said surge information transmitting means 14b;

said surge information transmitting means 14b sends said surge detection time and information on said polarity to said master station 2 via a communication network;

said substation surge information receiving means 21b receives said surge detection time and said information on polarity, which are transmitted from said surge information transmitting means 14b, via the communication network, transmits said information on polarity to said fault section identifying means 23b, and transmits said surge detection time to said fault location identifying means 23c;

said fault section identifying means 23b identifies a section with no branch as the section of an occurrence of a fault on the basis of information on said polarity of each substation 1 and transmits said section as a fault section to said fault location identifying means 23c;

said fault location identifying means 23c identifies the point of occurrence of a fault along the TD line on the basis of a difference in the time of detection of said surge detected by substations 1 at both ends of said fault section, and the length of said fault section along the TD line;

said TD line map information preparing means 23a identifies said point of occurrence of a fault along the TD line on a TD line of said TD line map information, re-prepares the TD line map information in consideration of said identified information at the point of occurrence of a fault as well, and transmits said re-prepared TD line map information to said TD line map information output means 24; and said TD line map information output means 24 outputs said re-prepared TD line map information.

A fault point location system of a ninth embodiment in the fault point location system according to any one of embodiment 7 or 8, wherein said surge propagation velocity is 150 to 300 m/$\mu$s.

Furthermore, said TD line map information can be prepared using a TD line map information preparing system described below. That is, a TD line map information preparing system comprises;

substations 1 which are installed along a TD line to transmit information on said TD line to a master station 2, and a master station 2 which prepares information along TD lines on the basis of information from said substations 1; and may be such that said substation 1 receives GPS radio waves from a satellite for identifying its own position on the basis of said GPS radio waves and then transmits information on said own position to said master station 2 via communication networks, said master station 2 receives the information on the position of said substation 1 sent by said substation 1 via communication networks for preparing TD line map information which has TD lines illustrated on a map on the basis of map information on a region where each substation is installed and information on the position of said substations, and then outputs said TD line map information.

Furthermore, this TD line map information preparing system may comprise;

substations 1 which are installed along a TD line to transmit information on said TD line to a master station 2, and a master station 2 which prepares information on TD lines on the basis of information from said substations 1.

Additionally, the map information storage means 22, in "providing map information", may provide map information that is "stored" therein for the TD line map information preparing means 23a, or map information stored in other storage means may be retrieved via a communication network and then provided for the TD line map information preparing means 23a.

According to the foregoing TD line map information preparing system, TD line map information with TD lines illustrated on a map can be quickly re-prepared in response to relocation or extension of the TD line. Therefore, the latest TD line map information can always be provided.

A fault point location system of a tenth embodiment comprising;

substations 1 installed along TD lines for sending information on said TD lines to a master station 2, and the master station 2 for locating fault points on the basis of the information sent by said substations 1;

characterized in that said substation 1 has a clock function, receives radio waves from a GPS satellite to identify the current time of the GPS, is able to synchronize the current time of said GPS with the self current time, detects a surge current or surge voltage of the TD line on which said substation 1 is installed to identify a surge detection time, the time at which said surge current or surge voltage is detected, recognizes the polarity of said surge current, and then sends said surge detection time and information on said polarity to said master station 2 via a communication network; and said master station 2 receives said surge detection time and information on said polarity, which are transmitted from said substation 1 via the communication network, identifies a potential point of an occurrence of a fault along the TD line on the basis of a difference in said surge detection time between said substation 1 which is the nearest to the source-side of said TD line and a plurality of distal end substations 1 of said TD line, and the length of the TD line between said substations 1 and 1, and totally identifies a predetermined range of a TD line with said potential point as a fault point potential section, and identifies a section with no branch as a section of an occurrence of a fault to determine a fault section on the basis of the information on polarities of a substation 1 within said fault point potential section and a substation 1, which is not included in said fault point potential section, adjacent to the substation 1 which is included in said fault point potential section.

In the foregoing, for example, determining the identified "section with no branch" not to be "a fault section" straightforwardly, but determining a section that is included both in the identified "section with no branch" and "fault point potential section" allows for confining a "fault section" by a narrower range.

The foregoing embodiment is valid particularly in the case where the "predetermined range with a potential point" provides a basis in selecting "a fault point potential section".

A fault point location system of an eleventh embodiment has, in the fault point location system according to embodiment 10:

said substation 1 comprising a GPS receiving means 11, a time measuring means 12, a surge detection means 13, and a surge information transmitting means 14b, wherein said GPS receiving means 11 receives GPS radio waves from satellites for identifying the current time of the GPS and sends the current time of said GPS to said time measuring means 12, said time measuring means 12 has a clock function for synchronizing the current time of said GPS from said GPS receiving means 11 with the current time of said substation 1 and then sends information on said current time of said substation 1 to the surge detection means 13, said surge detection means 13 detects a surge current or surge voltage of a TD line along which said substation 1 is installed, identifies the time of surge detection time at which said surge detection signal is received on the basis of information on the time sent by said time measuring means 12, also recognizes a polarity of said surge current, and transmits said surge detection time and said polarity to said surge information transmitting means 14b, and said surge information transmitting means 14b sends said surge detection time and said information on polarity to said master station 2 via a communication network; and said master station 2 comprising a substation surge information receiving means 21b, a fault point potential identifying means 23e, and a fault range confining means 23d, wherein said substation surge information receiving means 21b receives said surge detection time sent by said surge information transmitting means 14b and said information on polarity via a communication network, then sends said surge detection time to said fault point potential identifying means 23e, and sends said information on polarity to said fault range confining means 23d, said fault point potential identifying means 23e identifies a potential point of occurrence of a fault along the TD line on the basis of a difference in said surge detection time between said substation 1 which is the nearest to the source-side end of said TD line and a plurality of distal end substations 1 of said TD line, and the length of the TD line between said substations 1 and 1, and totally identifies a predetermined range of a TD line with said potential point as a fault point potential section to be transmitted to said fault range confining means 23d, said fault range confining means 23d identifies a section with no branch as a section of an occurrence of a fault to determine a fault section on the basis of the information on polarities of a substation 1 within said fault point potential section and a substation 1, which is not included in said fault point potential section, adjacent to the substation 1 which is included in said fault point potential section.

In the foregoing, assume the "polarity" of a surge current "positive (+)" for ground fault current flowing from a source-side to a load-side and "negative (−)" for ground fault current flowing from the load-side to the source-side.

Additionally, the "source-side end" is an end that is connected to a source of a power station in a TD network. The "distal end" is an end of a TD network, from which the TD line extends no further.

The "predetermined range with a potential point" can be determined, for example, according to the basis of errors conceivable for a predicted position of the "potential point".

Furthermore, the number of "potential points of the an occurrence of a fault" to be determined is equal to or greater than the number of "distal end substations" for which a difference in surge detection time has been discussed, thus being equal to the number of "predetermined ranges of the TD line with potential points". The fault point potential identifying means totals the TD lines to determine the fault point potential sections.

A fault point location system of a twelfth embodiment, according to embodiment 10 or 11, wherein said fault point potential identifying means 23e determines distance L1 along the TD line from said source-side end substation to the point of the fault on the TD line by equation L1=(L+(t1−t2)×v)/2, on the basis of said surge detection time t1 at the substation 1 nearest to the source-side end of said TD line, said surge detection time t2 at a distal end substation of said TD line, surge propagation velocity v, and length L of the TD line between said substations 1 and 1.

A fault point location system of a thirteenth embodiment, according to embodiment 11, wherein said fault point potential identifying means 23e determines distance L2 along the TD line from said distal end substation to the point of the fault along the TD line by equation L2=(L+(t1−t2)×v)/2, on the basis of said surge detection time t1 at the substation 1 nearest to the source-side end of said TD line, said surge detection time t2 at a distal end substation of said TD line, surge propagation velocity v, and length L of the TD line between said substations 1 and 1.

A fault point location system of a fourteenth embodiment, according to embodiment 11, wherein said fault range confining means:

1, selects one predetermined TD line from a group of TD lines among substations included within said fault location potential sections and substations that are not included within said fault point potential sections but adjacent to substations included within said fault point potential sections and are added to said fault point potential sections into a group of TD lines;

2. compares data of a surge rising polarity of a substation with that of its neighboring substation on said TD line selected;

3. selects one predetermined TD line from a group of TD lines among substations included within said fault point potential sections and substations that are not included within said fault point potential sections but adjacent to substations included within said fault point potential sections and are added to said fault point potential sections into a group of TD lines if there is no substation of a polarity opposite to the neighboring substation thereof to be replaced for said "one TD line selected" and then performs from the procedure 2, and decides that there is no fault point if there is no TD line along which a fault section has not been checked;

4. if there is a substation of a polarity opposite to that of its neighboring substation and the section with these substations located at the ends of the section has no branch, identifies the section as a fault section;

5. if there is a substation of a polarity opposite to that of its neighboring substation and the section with these substations located at the ends of the section has a branch, compares the surge rising polarity data of the most upstream substation among the substations of the spur TD line with the surge rising polarity data of the upstream substation among substations which have a polarity opposite to that of their neighboring substation of the trunk TD line;

6. if there the polarity of the most upstream substation among the substations of said spur TD line is opposite to the polarity of the upstream substation among substations which have a polarity opposite to their neighboring substation of said trunk TD line, determines, to be a fault section, the section from the most upstream substation among the substations of said spur TD line through the upstream substation among substations which have a polarity opposite to their neighboring substation of said trunk TD line to the downstream substation among substations which have a polarity opposite to their neighboring substation of said trunk TD line; and 7. if there the polarity of the most upstream substation among the substations of said spur TD line is the same as the polarity of the upstream substation among substations which have a polarity opposite to their neighboring substation of said trunk TD line, selects one TD line from said spur TD lines to be replaced for said "one TD line selected" and then performs the procedures from the foregoing procedure 2. In the foregoing, "to select one TD line" is defined as to select a series of TD lines with no branch out of TD lines with branches along the lines thereof, whereas defined as to select a TD line out of a TD line with no branch. In addition, the "spur TD line" is a TD line branched from "one TD line selected". The "trunk TD line" is "one TD line selected". The "spur" and "trunk" indicates, however, only a relative relationship of TD lines to be branched. Accordingly, the "trunk TD line" is not always connected directly to a power station.

Moreover, the "upstream" indicates source-side, while "downstream" indicates load-side.

A fault point location system according to any one of embodiments 12 through 14, is provided wherein said surge propagation velocity may be determined to be equal to 150 to 300 m/μs. The above-mentioned allows a point of occurrence of a fault to be identified accurately on actual TD lines.

The fault point location system of the present invention can be the embodiment mentioned below.

That is, the master station 2 not only identifies a fault section but also prepares TD line map information according to information from substations 1 to display fault sections thereon.

A fault point location system of this embodiment is provided with said substation 1 comprising a GPS receiving means 11, a time measuring means 12, a surge detection means 13, a self-position information transmitting means 14a, and a surge information transmitting means 14b.

Said master station 2 comprises a substation location information receiving means 21a, a substation surge information receiving means 21b, a map information storage means 22, a TD line map information preparing means 23a, a fault point potential identifying means 23e, a fault range confining means 23d, and TD line map information output means 24.

Furthermore, a fault point location system of this embodiment has components with the following functions for preparing TD line map information.

That is, said GPS receiving means 11 receives GPS radio waves from a satellite for identifying its own position on the basis of said GPS radio waves and then transmits information on said own position to said self-position information transmitting means 14a;

said self-position information transmitting means 14a transmits information on said own position to said master station 2 via communication networks;

said substation location information receiving means 21 receives the information on the position of said substation 1 sent by said self-position information transmitting means 14a via communication networks to transmit the information on the position of said substation 1 to said TD line map information preparing means 23a;

said map information storage means 22 is able to provide map information on a region where each substation is installed for said TD line map information preparing means 23a;

said TD line map information preparing means 23*a* receives said map information from said map information storage means 22 for preparing TD line map information which has TD lines illustrated on a map on the basis of said map information and the information on the position of said substations which was received from said substation location information receiving means 21*a* to transmit said TD line map information to said TD line map information output means 24; and said TD line map information output means 24 outputs said TD line map information.

Additionally, the map information storage means 22, in "providing map information", may provide map information that is "stored" therein for the TD line map information preparing means 23*a*, or map information stored in other storage means may be retrieved via a communication network and then provided for the TD line map information preparing means 23*a*.

According to the foregoing TD line map information preparing system, TD line map information with TD lines illustrated on a map can be quickly re-prepared in response to relocation or extension of the TD line. Therefore, the latest TD line map information can always be provided.

Still furthermore, the fault point location system has components with the following functions for preparing TD line map information.

That is, said GPS receiving means 11 receives GPS radio waves from satellites for identifying the current time of the GPS and sends the current time said GPS has to said time measuring means 12, said time measuring means 12 has a clock function for synchronizing the current time of said GPS from said GPS receiving means 11 with the current time of said substation 1 and then sends information on said current time of said substation 1 to the surge detection means 13, said surge detection means 13 detects a surge current or surge voltage of a TD line along which said substation 1 is installed, identifies the time of surge detection time at which said surge detection signal is received on the basis of information on the time sent by said time measuring means 12, also recognizes a polarity of said surge current, and transmits said surge detection time and said polarity to said surge information transmitting means 14*b*, and said surge information transmitting means 14*b* sends said surge detection time and said information on polarity to said master station 2 via a communication network.

Said substation surge information receiving means 21*b* receives said surge detection time sent by said surge information transmitting means 14*b* and said information on polarity via a communication network, then sends said surge detection time to said fault point potential identifying means 23*e*, and sends said information on polarity to said fault range confining means 23*d*, said fault point potential identifying means 23*e* identifies a potential point of occurrence of a fault along the TD line on the basis of a difference in said surge detection time between said substation 1 which is the nearest to the source-side end of said TD line and a plurality of distal substations 1 of said TD line, and the length of the TD line between said substations 1 and 1, and totally identifies a predetermined range of a TD line with said potential point as a fault point potential section to be transmitted to said fault range confining means 23*d*.

Said fault range confining means 23*d* identifies a section with no branch as a section of an occurrence of a fault to determine a fault section on the basis of the information on polarities of a substation 1 within said fault point potential section and a substation, which is not included in said fault point potential section, adjacent to the substation 1 which is included in said fault point potential section;

said TD line map information preparing means 23*a* identifies said fault section of said TD line on a TD line of said TD line map information, re-prepares the TD line map information in consideration of said identified information at the point of occurrence of a fault as well, and transmits said re-prepared TD line map information to said TD line map information output means 24; and said TD line map information output means 24 outputs said re-prepared TD line map information.

A fault point location system of the foregoing embodiment allows points of occurrence of a fault along TD lines to be displayed on the latest TD line map. Accordingly, maintenance personnel are able to rush to the spot of the fault point for quick recovery from the fault according to the TD line map prepared in accordance with the latest map.

EFFECTS OF THE INVENTION

According to the fault point location system of the first or the second embodiment, when a fault occurs along a TD line, the point of the fault can be quickly and accurately located.

According to the fault point location system of the third or the seventh embodiment, the point of occurrence of a fault along a TD line can be readily and effectively identified on the basis of a difference in surge detection time between both ends of the fault section.

According to the fault point location system of the fourth or the eighth embodiment, even when a fault occurs along a TD line with branches, the section with a fault point can be confined effectively to a section with no branch. Therefore, the fault point identifying method based on a difference in surge detection time between both ends of the fault section with no branch can be made available.

According to the fault point location system of the fifth or the sixth embodiment, when a fault occurs along a TD line, the location of the fault can be displayed on a TD line map prepared in accordance with the latest map. Accordingly, maintenance personnel are able to rush to the spot of the fault point for quick recovery from the fault according to the TD line map prepared in accordance with the latest map.

According to the fault point location system of the ninth embodiment, the point of occurrence of a fault on actual TD lines can be accurately identified.

The fault point location system of the tenth or eleventh embodiment allows, when a fault has occurred along a TD line, the fault point to be identified quickly and accurately.

According to the fault point location system of the twelfth or thirteenth embodiment, potential points of occurrence of a fault along a TD line can be identified readily and effectively on the basis of a difference in surge detection time between both ends of the fault section.

According to the fault point location system of the fourteenth embodiment, a fault section can be effectively located out of fault point potential sections determined according to a plurality of potential points.

PREFERRED EMBODIMENTS OF THE INVENTION

The embodiments of the present invention will be explained below with reference to the attached drawings.

[An Embodiment]

(1) The configuration of a fault point location system

Figure 1:
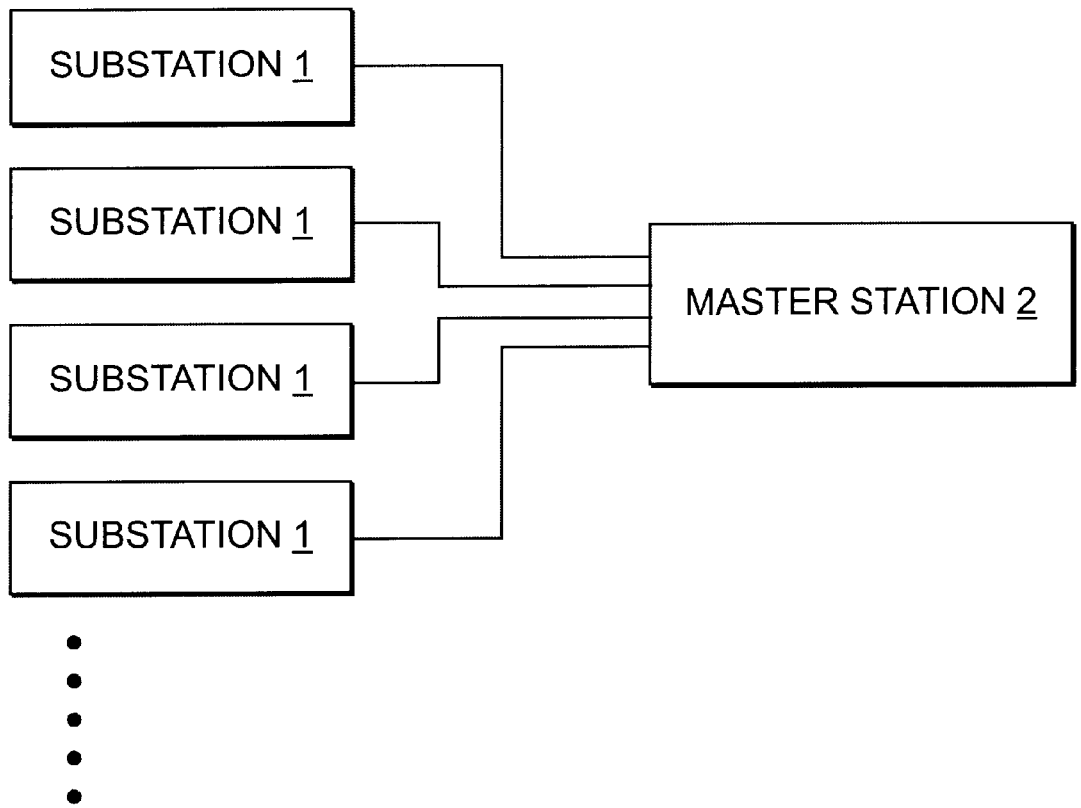
FIG. 1 is an explanatory view showing the relationship between a master station and substations.

As shown in FIG. 1, the fault point location system of an embodiment of the present invention comprises;

substations 1 which are installed at each steel tower or pole along TD lines and a master station 2 which are installed at a service office or branch office of a power company, prepares TD line maps on the basis of information from substations 1 for locating fault points.

(a) Substations

Figure 2:
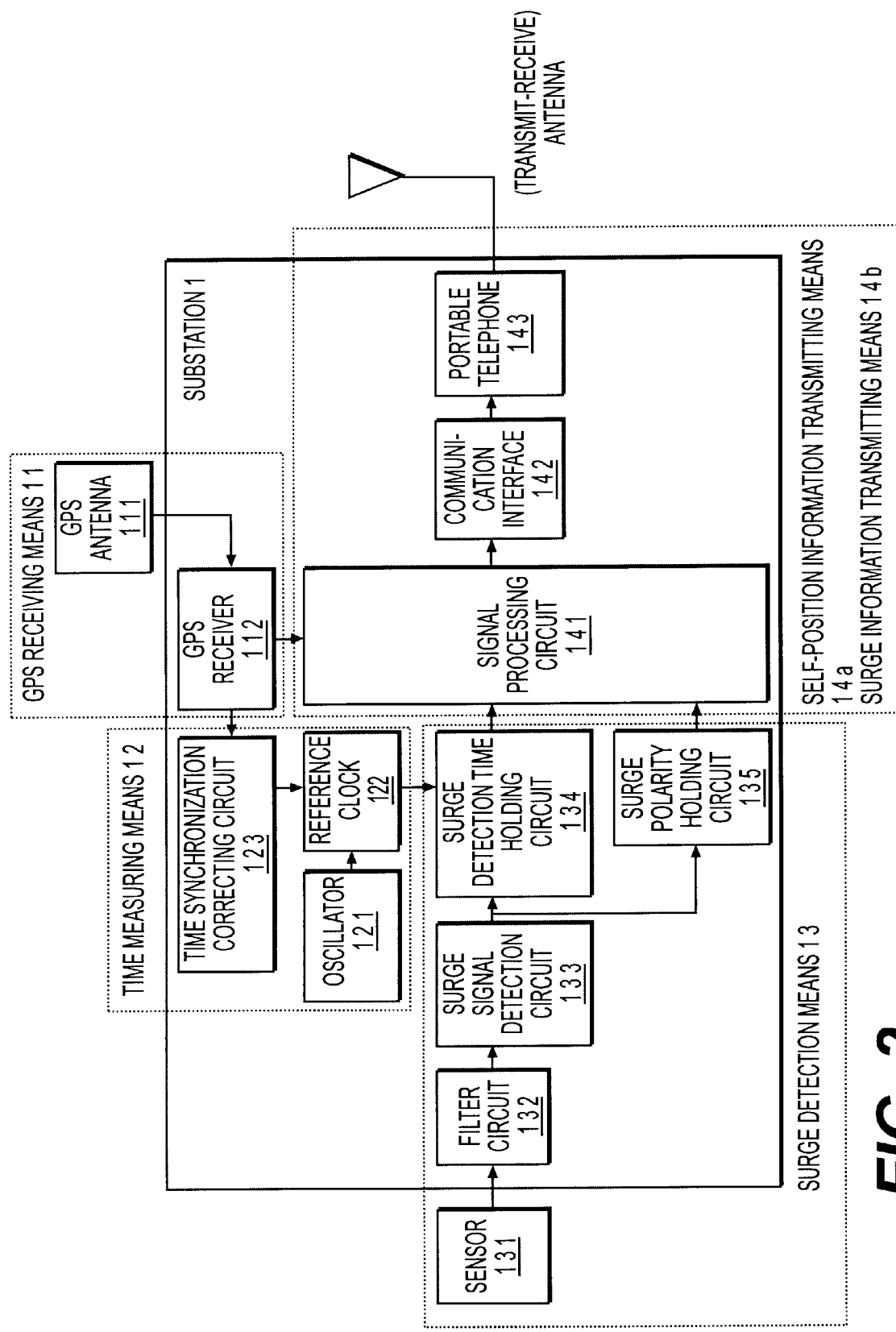
FIG. 2 is an explanatory view showing each component of substations used in the embodiment 1 and the embodiment 2.

As shown in FIG. 2, a substation 1 is provided with a GPS antenna 111, a GPS receiver 112, an oscillator 121, reference clock 122, a time synchronization correcting circuit 123, a sensor 131, a filter circuit 132, a surge signal detection circuit 133, a surge detection time holding circuit 134, a surge polarity holding circuit 135, a signal processing circuit 141, a communication interface 142, and a portable telephone 143.

The GPS antenna 111 and the GPS receiver 112 correspond to the "GPS receiving means 11" designated in the summary and claims of the invention. Similarly, the oscillator 121, the reference clock 122, and the time synchronization correcting circuit 123 correspond to the "time measuring means 12".

Likewise, the sensor 131, the filter circuit 132, the surge signal detection circuit 133, the surge detection time holding circuit 134, and the surge polarity holding circuit 135 correspond to the "surge detection means 13". Furthermore in a like manner, the signal processing circuit 141, the communication interface 142, and the portable telephone 143 correspond to the "self-position information transmitting means 14a" and the "surge information transmitting means 14b".

Each component will be explained below.

i) Sensor 131

The sensor 131 is mounted to a steel tower of a TD line to detect surge signals that occur at the time of a fault and then send them to the filter circuit 132.

ii) Filter Circuit 132

The filter circuit 132 filters signals, which the sensor 131 has detected, to remove unnecessary commercial frequency components except for a surge signal and allows only the surge signal to pass to the surge signal detection circuit 133.

iii) Surge Signal Detection Circuit 133

The surge signal detection circuit 133 detects the level of a surge signal and then determines it to be a fault if the signal level exceeds a predetermined value, whereupon outputting a time holding signal to the surge detection time holding circuit 134. In addition, the surge signal detection circuit 133 detects the polarity of the surge signal at the same time and then outputs the surge polarity signal to the surge polarity holding circuit 135.

iv) Surge Detection Time Holding Circuit 134

When a time holding signal is outputted from the surge signal detection circuit 133, the surge detection time holding circuit 134 holds the time of the reference clock 122 at the time of the output to output the time as the surge detection time to the signal processing circuit 141.

v) Surge Polarity Holding-circuit 135

The surge polarity holding circuit 135 checks the surge polarity signal that is outputted from the surge signal detection circuit 133 to determine the polarity of the surge signal, outputting the determined result as the surge polarity to the signal processing circuit 141.

vi) GPS Antenna 111 and GPS Receiver 112

The GPS antenna 111 receives radio waves from a GPS satellite to send the radio waves to the GPS receiver 112. Then, the GPS receiver 112 extracts, as a synchronization signal, the information on the standard time given by the GPS satellite from the radio waves and then sends the signal to the time synchronization correcting circuit 123. In addition, the GPS receiver 112 identifies, on the basis of the GPS radio waves, location information (latitude, longitude, and altitude) such at as of a steel tower on which the substation 1 is mounted, outputting the information to the signal processing circuit 141.

vii) Time Synchronization Correcting Circuit 123

In accordance with the synchronization signal outputted by the GPS receiver 112, the time synchronization correcting circuit 123 synchronizes the time of the reference clock 122 with the standard time provided by a GPS satellite.

viii) Reference Clock 122

The reference clock 122 outputs reference time to the surge detection time holding circuit 134.

ix) Oscillator 121

The oscillator 121 outputs the reference time signal for measuring time to the reference clock 122.

x) Signal Processing Circuit 141

The signal processing circuit 141 sends location information that is outputted by the GPS receiver 112 to the master station 2 via the communication interface 142 and the portable telephone 143. Furthermore, the signal processing circuit 141 sends the surge detection time and surge polarity that are outputted by the surge detection time holding circuit 134 and the surge polarity holding circuit 135 to the master station 2 via the communication interface 142 and the portable telephone 143.

xi) Communication Interface 142

The communication interface 142 performs mutual conversion of communication signals between the signal processing circuit 141 and the portable telephone 143 to enable the portable telephone 143 to communicate with the master station 2.

xii) Portable Telephone 143

The portable telephone 143 sends the converted signal that has been received from the communication interface 142 to the master station 2.

Substations 1 comprising the foregoing components have their own substation numbers, respectively.

As shown in FIG. 7 and FIG. 10 through FIG. 12, in the present embodiment, the substations of the trunk line are given only trunk line numbers such as ①, ②, ③ . . . The trunk line numbers of substations on the trunk line are given to increase in sequence from the source side to the load side.

In addition, as shown in FIG. 7 and FIG. 10 through FIG. 12, each substation on spur lines branching from the trunk line has a substation number on the trunk line where the substation branches from the trunk line, and the spur line number which is numbered so as to increase in sequence from the source side to the load side. That is, substation numbers are given to substations on the spur lines branching from substation ② of the trunk line as ②-①, ②-②, ②-③ . . . in sequence from the substation nearest to the substation ② of the trunk line.

Although not exemplified in the present embodiment, if a spur line branch has another spur line, for example, when ②-② has a spur line, numbers such as ②-②-①, ②-②-②, ②-②-③ . . . are given to the substations distributed to the branched spur line.

In the present embodiment, the substation numbers are given to show whether a substation belongs to a TD line of the trunk line or to a TD line of the spur line, and to show the upstream and downstream relationship between substations. However, the method of maintaining number information is not limited to this embodiment. That is, each substation may have its own number that has nothing to do with the upstream and downstream relationship between substations, and may have, as information, the number of a substation locating upstream from the self-station and the number of a substation locating downstream from the self-station. In this case, if a substation has a plurality of "substation numbers locating downstream from the self-station", this shows that the TD line has a branch or branches at the substation.

Furthermore, master stations may store upstream and downstream relationship between substations. That is, master stations may have a "network storage means" to store the upstream and downstream relationship of each substation, the distance of the TD line between substations, and whether each substation belongs to a TD line of a trunk line or to a TD line of a spur line.

b) Master Station

Figure 3:
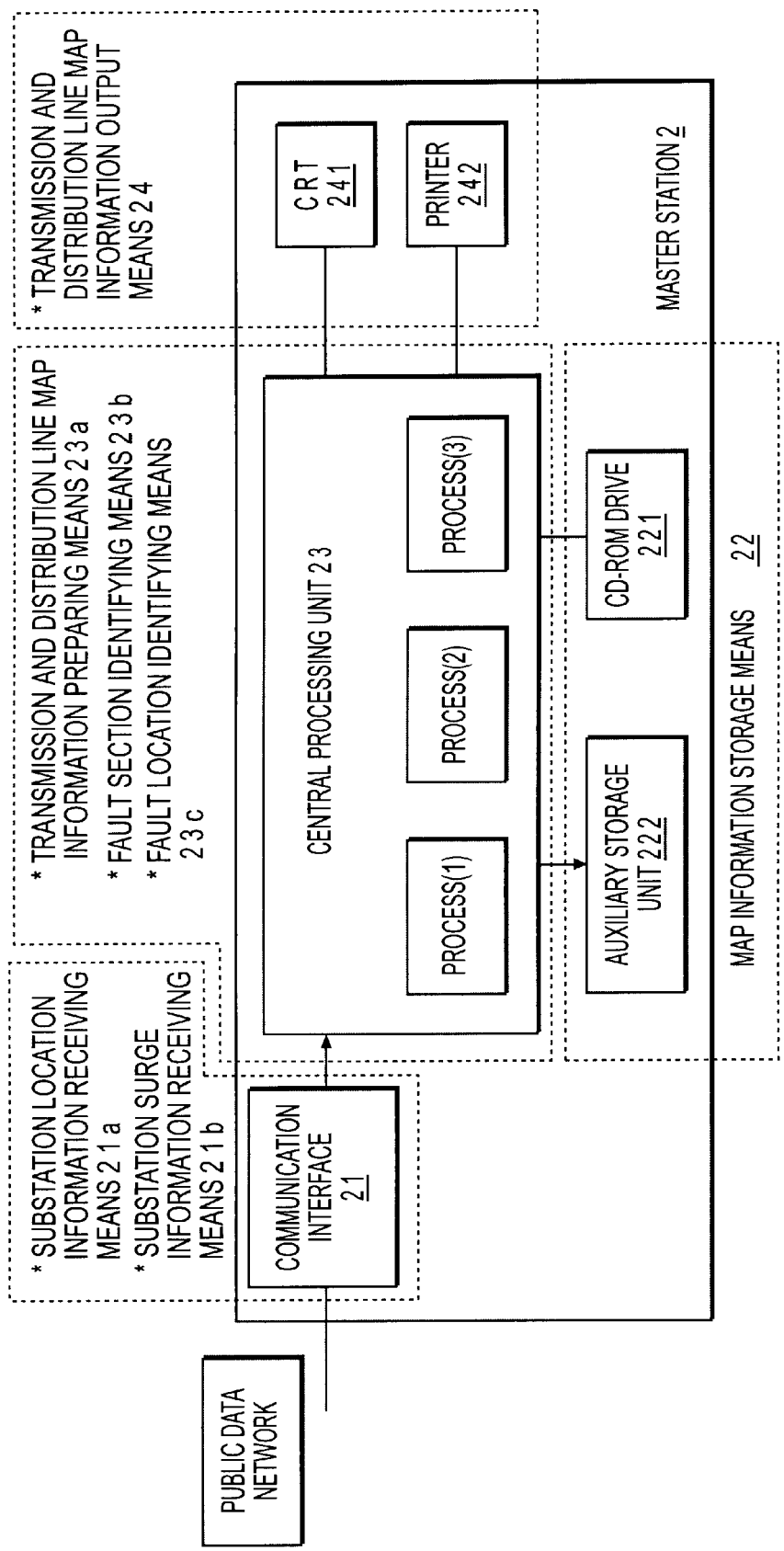
FIG. 3 is an explanatory view showing each component of a master station used in the embodiment 1.

As shown in FIG. 3, a master station 2 comprises a communication interface 21, a CD-ROM drive 221 with a CD-ROM mounted therein, an auxiliary storage unit 222, a central processing unit 23, a CRT 241, and a printer 242.

The communication interface 21 corresponds to the "substation location information receiving means 21a" and "substation surge information receiving means 21b" designated in the summary and claims of the invention. Similarly, the CD-ROM mounted in the CD-ROM drive 221 and the auxiliary storage unit 222 correspond to the "map information storage means 22". The central processing unit 23 corresponds to the "TD line map information preparing means 23a", the "fault section identifying means 23b", and "fault location identifying means 23c". Likewise, the CRT 241 and the printer 242 correspond to the "TD line map information output means 24".

Each component will be explained below.

i) Communication Interface 21

The communication interface 21 converts a signal transmitted from a substation 1 via the public data network to supply the converted signal to the central processing unit 23.

ii) Central Processing Unit 23

The central processing unit 23 receives the location information and fault information (the surge detection time and polarity), transmitted by each substation 1, 1, 1 . . . via the communication interface 21 and performs the TD line map preparation processing, the fault section identification processing, and the fault point location processing, which will be described later.

Figure 15:
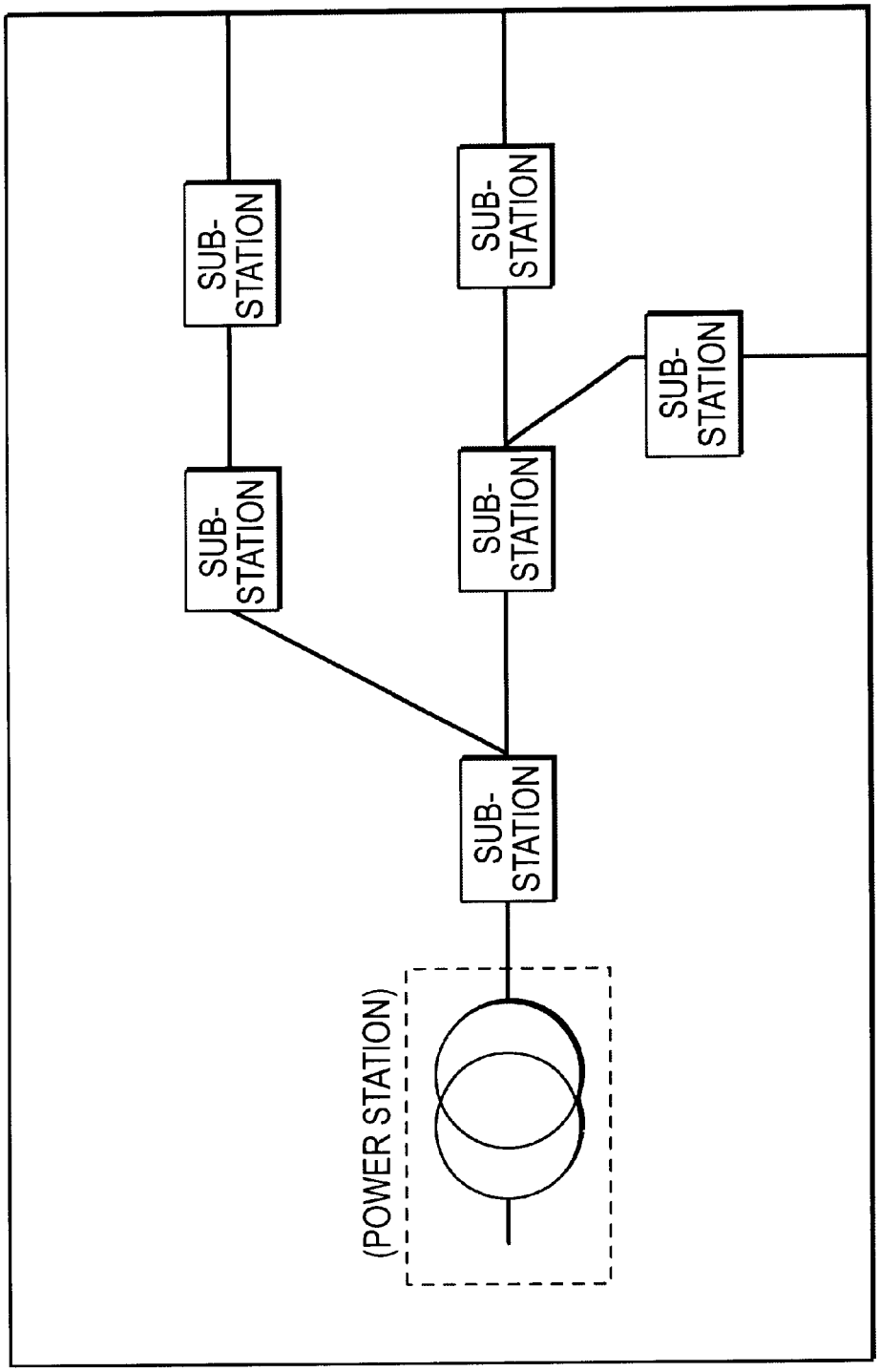
FIG. 15 is an explanatory view showing the TD line map information display.
Figure 16:
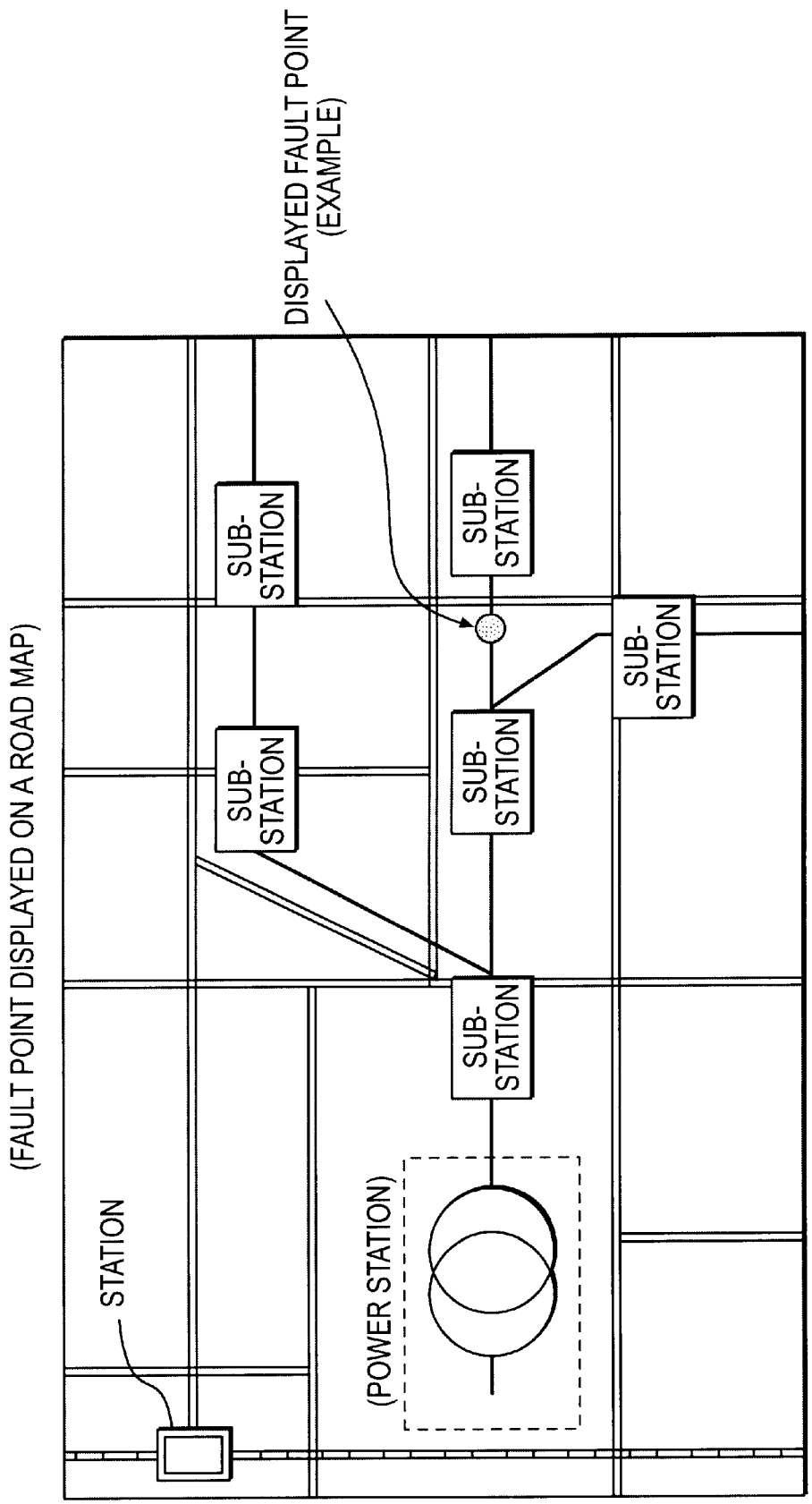
FIG. 16 is an explanatory view showing a screen for displaying a TD line map information which is re-prepared considering map information and information on fault points.

The TD line map data, shown in FIG. 15, which is prepared by the TD line map preparation processing is stored in the auxiliary storage unit 222. As shown in FIG. 16, the TD line map data processed by the fault point location processing is outputted to the CRT 241 or the printer 242 together with the map data read out from a CD-ROM in the CD-ROM drive 221.

iii) Auxiliary Storage Unit 222

The auxiliary storage unit 222 stores various information (data), necessary for the central processing unit 23 to perform processing, such as location information and fault information transmitted by each substation 1, 1, 1 . . . and the TD line map data processed by the central processing unit 23.

iv) Printer 242

Following the command by the central processing unit 23, the printer 242 prints out the TD line map or the results of fault location, which are sent by the central processing unit 23.

v) CD-ROM Drive 221 and CD-ROM

Figure 14:
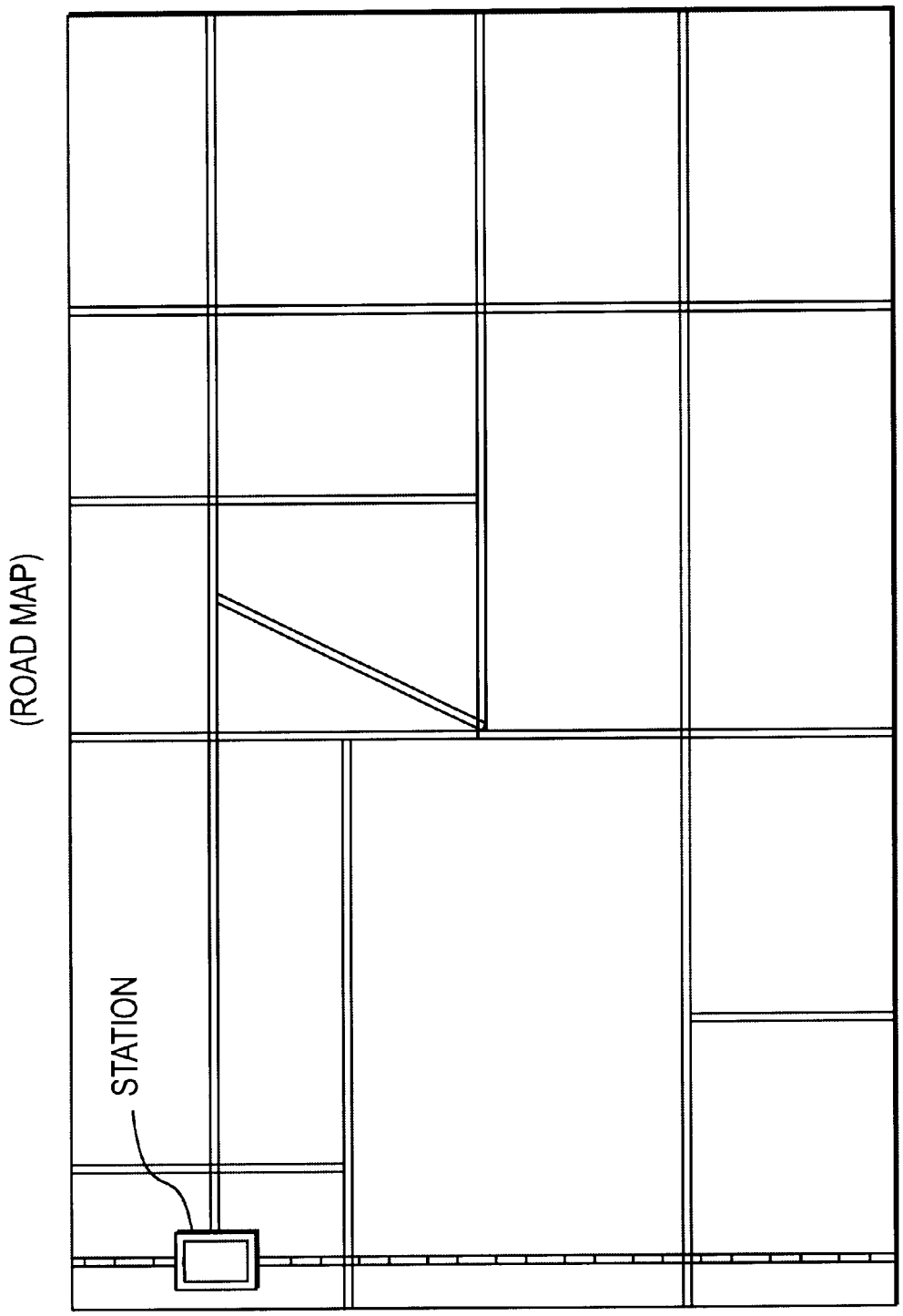
FIG. 14 is an explanatory view showing a screen for displaying the map information.

The CD-ROM is provided with map data such as of roads and buildings as shown in FIG. 14. The CD-ROM drive 221 reads out the map data recorded in the CD-ROM and sends the information to the central processing unit 23 as necessary.

vi) CRT 241

Following the command of the central processing unit 23, the CRT 241 displays the TD line map or the results of fault location, which are sent by the central processing unit 23.

(2) Processing in the fault point location system (a) Preparation of TD Line Maps The procedures for automatically re-preparing the TD line map data in response to relocation and extension of substations will be explained referring to FIG. 4 through FIG. 7.

Starting the operation of a substation 1 causes the GPS antenna 111 to receive radio waves from the GPS satellite, then allowing the GPS receiver 112 to determine the location (latitude, longitude, and altitude) thereof, where the GPS receiver 112 is installed, on the basis of the radio waves. Subsequently, the information is sent as the location information to the master station 2 together with the substation number of said substation by means of the portable telephone 143.

At the master station 2, the central processing unit 23 receives the location information of each substation 1, 1, 1 . . . via the communication interface 21. The central processing unit 23 prepares, in the memory thereof, a virtual sheet for preparing a TD line map that has the same coordinate system as the map of the CD-ROM in the CD-ROM drive 221 and then automatically prepares a TD line map on the virtual sheet on the basis of substation numbers and location information sent from each substation 1, 1, 1 . . .

These procedures are briefly shown below.

Figure 4:
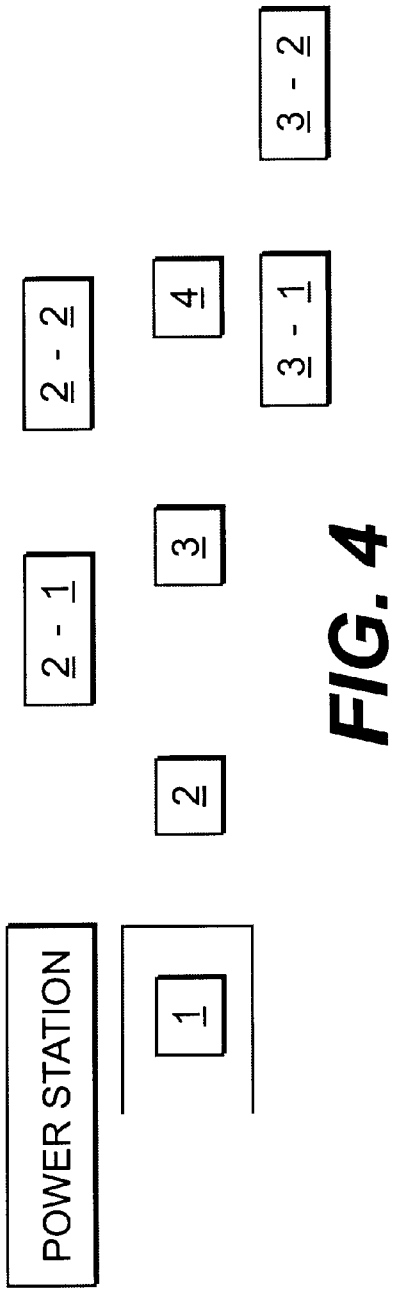
FIG. 4 is an explanatory view showing procedures for preparing of TD line map.

(Procedure 1) As shown in FIG. 4, symbols (rectangular boxes) designating each substation ①, ②, ②-①, ②-②, ③. . . are assigned to corresponding portions of the virtual sheet in the memory according to substation numbers and location information of each substation 1, 1, 1 . . .

Relative locations of each substation are illustrated diagrammatically in FIG. 4 through FIG. 7, however, substations are arranged in practice following the locations on the map.

Figure 5:
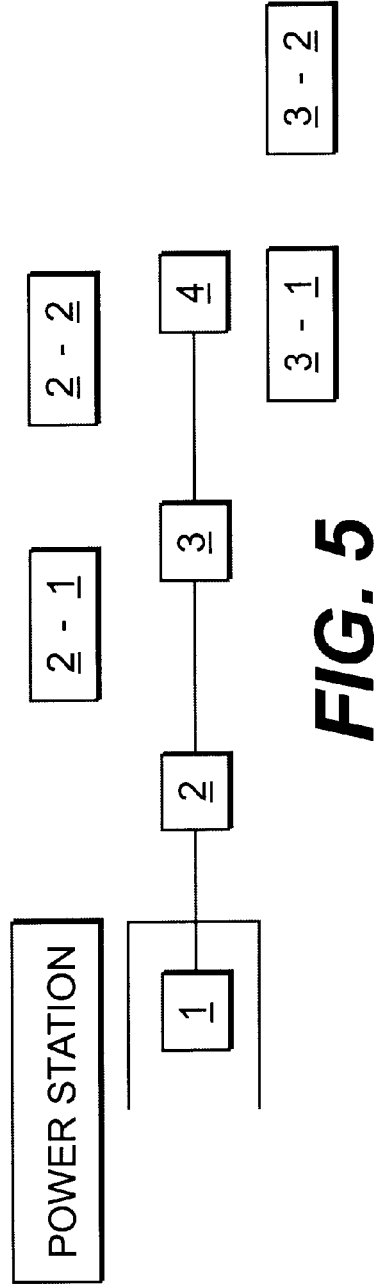
FIG. 5 is an explanatory view showing procedures for preparing of TD line map.

(Procedure 2) As shown in FIG. 5, the substations ①, ②, ③. . . are selected that are constituted only by trunk line numbers, and then neighboring substations are connected in an incremental order of trunk line numbers with a symbol (a straight line) designated for a transmission line.

Figure 6:
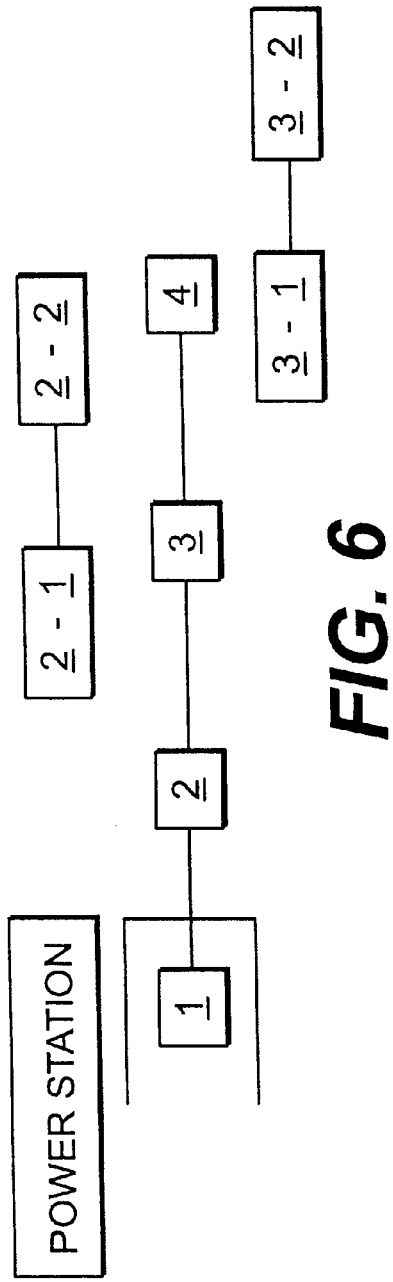
FIG. 6 is an explanatory view showing procedures for preparing of TD line map.

(Procedure 3) As shown in FIG. 6, the substations ②-①, ②-②, ③-①. . . are selected that are constituted by trunk line and spur line numbers, and then neighboring substations with the same trunk line number are connected in an incremental order of spur line numbers with a symbol (a straight line) designated for a transmission line.

Figure 7:
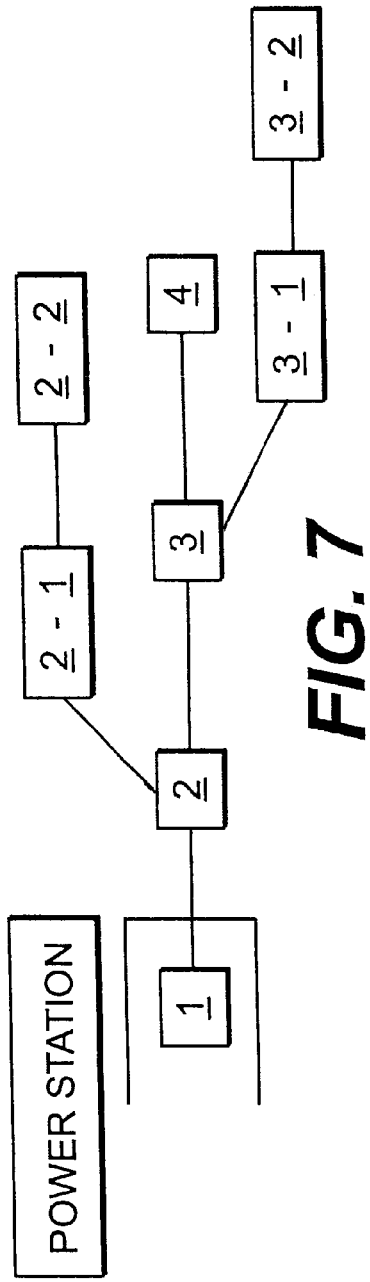
FIG. 7 is an explanatory view showing procedures for preparing of TD line map.

(Procedure 4) As shown in FIG. 7, among substations ②-① and ②-② that have the same trunk line number, the substation ②-① that has the smallest spur line number is connected, with a symbol (a straight line) designated for a transmission line, to a substation ② that is constituted only by the same trunk line number as the trunk line number of the substation ②-①. The same procedure is performed for all trunk line numbers.

In the case where each substation has its own number that has nothing to do with upstream and downstream relations between substations, and has as information the number of a substation locating upstream from the substation and the number of a substation locating downstream from the substation, a TD line map can be prepared by arranging each substation according to the location thereof on the map and then by connecting substations to each other on the basis of information on substations locating upstream and downstream form the substation.

(b) Fault Location

The procedures for identifying a fault location in the case of an occurrence of a fault along a TD line will be explained below.

In order to apply the procedures for identifying a fault location from a difference in the detection time of a surge signal, it is necessary to identify the fault location with "a section with no branch" before the application of the procedures.

Therefore, the method for identifying the fault location with "a section with no branch" will be explained first in (I), and subsequently, the method for locating a fault within the "section with no branch" in accordance with a difference in the time of surge detection across the section will be explained in (II).

(I) Locating a Fault Section

As mentioned in the foregoing, upon detecting a surge signal occurring at the time of a fault, the substation 1 automatically sends the polarity of a rise of the surge signal and the time data of detection to the master station 2 as fault information together with the substation number.

At the master station 2, it is determined automatically at which substation section the fault occurred on the TD line map on the basis of the fault information sent by each substation 1, 1, 1 . . .

The principle and procedures for the determination will be described below.

i) Principle for Locating a Fault Section

Figure 8:
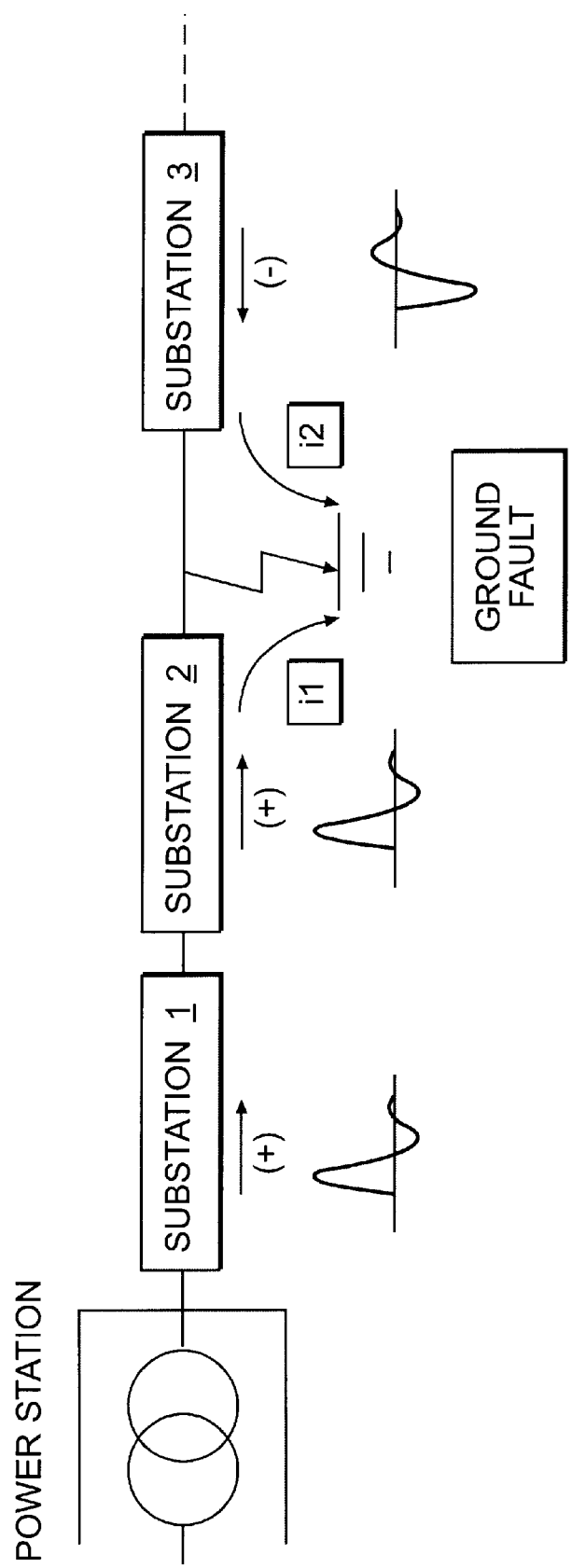
FIG. 8 is an explanatory view showing polarities of each substation in the case of a fault present along a TD line with no branch.

As shown in FIG. 8, when a line-to-ground fault occurs between neighboring substations ② and ③, ground fault surge currents i1 and i2 flow toward the fault location due to the earth stray capacitance of the TD line. Suppose the direction of ground fault surge currents is "+" for a current flowing from the source-side to the load-side and "−" for a current flowing from the load-side to the source-side, and the polarity of the ground fault surge currents becomes "+" at the substation ② and "−" at the substation ③. That is, the substations at both ends of the section with a fault point have mutually opposite polarities.

That is, the rising polarity data of ground fault surge currents are examined among fault information sent by each substation 1, 1, 1 . . . ; when a substation with the polarity opposite to that of a neighboring substation is found, it can be predicted that there is a fault within a section having the substation and the neighboring substation at both ends of the section.

Based on this principle, a fault section can be identified according to the procedures mentioned below.

ii) Procedures for Locating a Fault Section (Procedure 1) Select one TD line that extends from a power source. "To select one TD line" is defined as to select a series of TD lines with no branch out of the TD lines with branches along the lines thereof.

(Procedure 2) Compare data of a surge rising polarity of a substation with that of its neighboring substation along the TD line selected.

(Procedure 3) If there is no substation with a polarity opposite to its neighboring substation, decide that there is no fault and end the processing.

(Procedure 4) If there is a substation with a polarity opposite to that of its neighboring substation and the section with these substations located at the ends of the section does not have a branch, decide that the section is "the section with a fault" and then end the procedure.

(Procedure 5) If there is a substation with a polarity opposite to its neighboring substation and the section with these substations located at the ends of the section has a branch, compare the surge rising polarity data of the most upstream substation among substations of the spur TD line with the surge rising polarity data of the upstream substation among substations which have a polarity opposite to that of their neighboring substation of the trunk TD line (one TD line selected).

(Procedure 6) If the polarity of the most upstream substation among substations of the spur TD line is opposite to the polarity of the upstream substation among substations which have a polarity opposite to that of their neighboring substation of the trunk TD line, decide that the section ranging from the most upstream substation among substations of the spur TD line through the upstream substation among substations which have a polarity opposite to that of their neighboring substation of the trunk TD line to the downstream substation among substations which have a polarity opposite to that of their neighboring substation of the trunk TD line is a "section of a fault" and then end processing.

(Procedure 7) If the polarity of the most upstream substation among substations of the spur TD line is the same as the polarity of the upstream substation among substations which have a polarity opposite to that of their neighboring substation of the trunk TD line, select one TD line out of the spur TD lines to replace said "one TD line selected" with the TD line out of the spur TD lines and perform the procedures from the foregoing (Procedure 2).

Through the foregoing procedures, a "section of a fault" is located.

Figure 9:
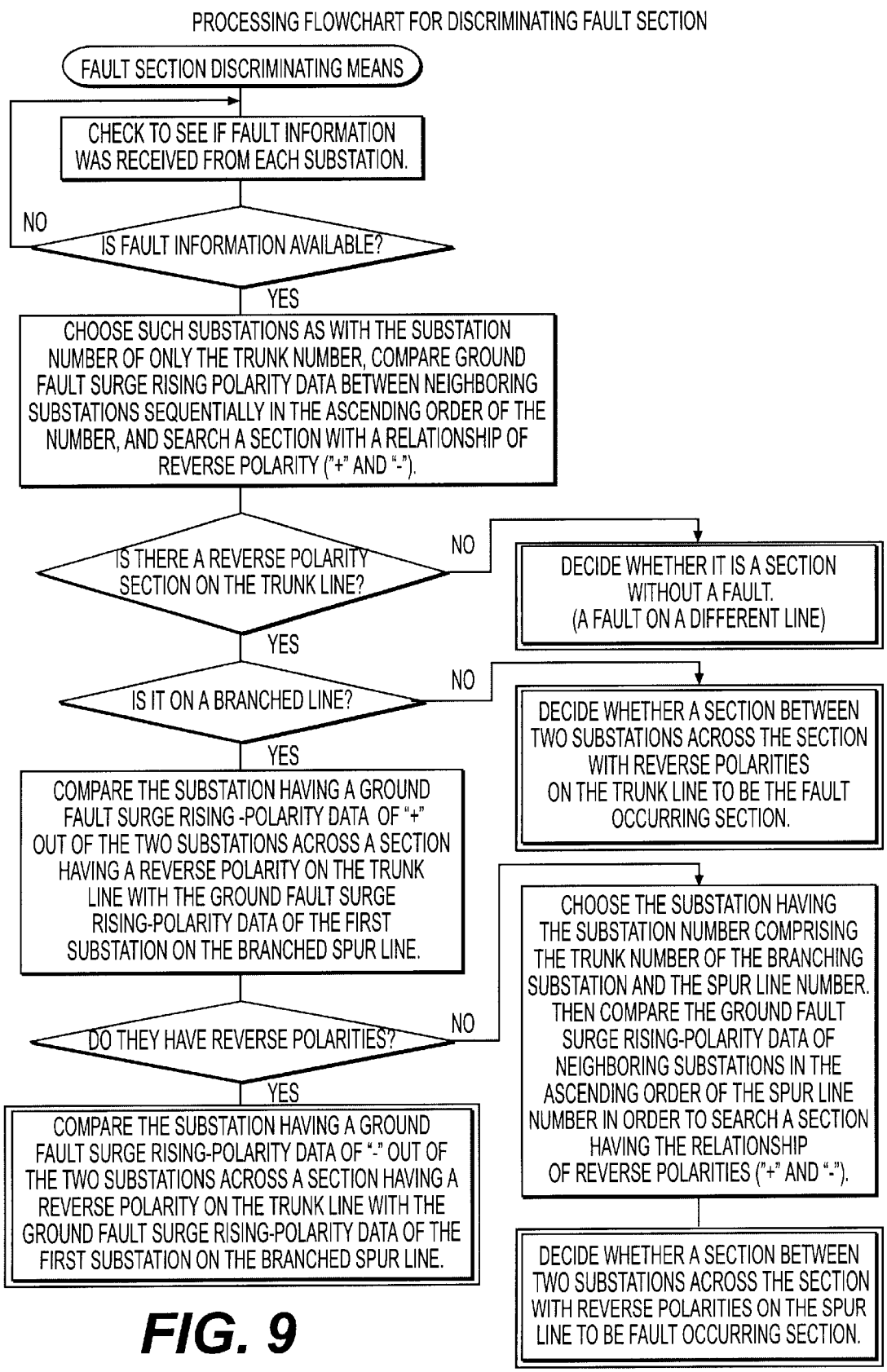
FIG. 9 is a flow diagram illustrating procedures for locating a faulted section.

Likewise, the procedures for identifying a section of a fault may be such as shown in the flow diagram of FIG. 9.

Figure 10:
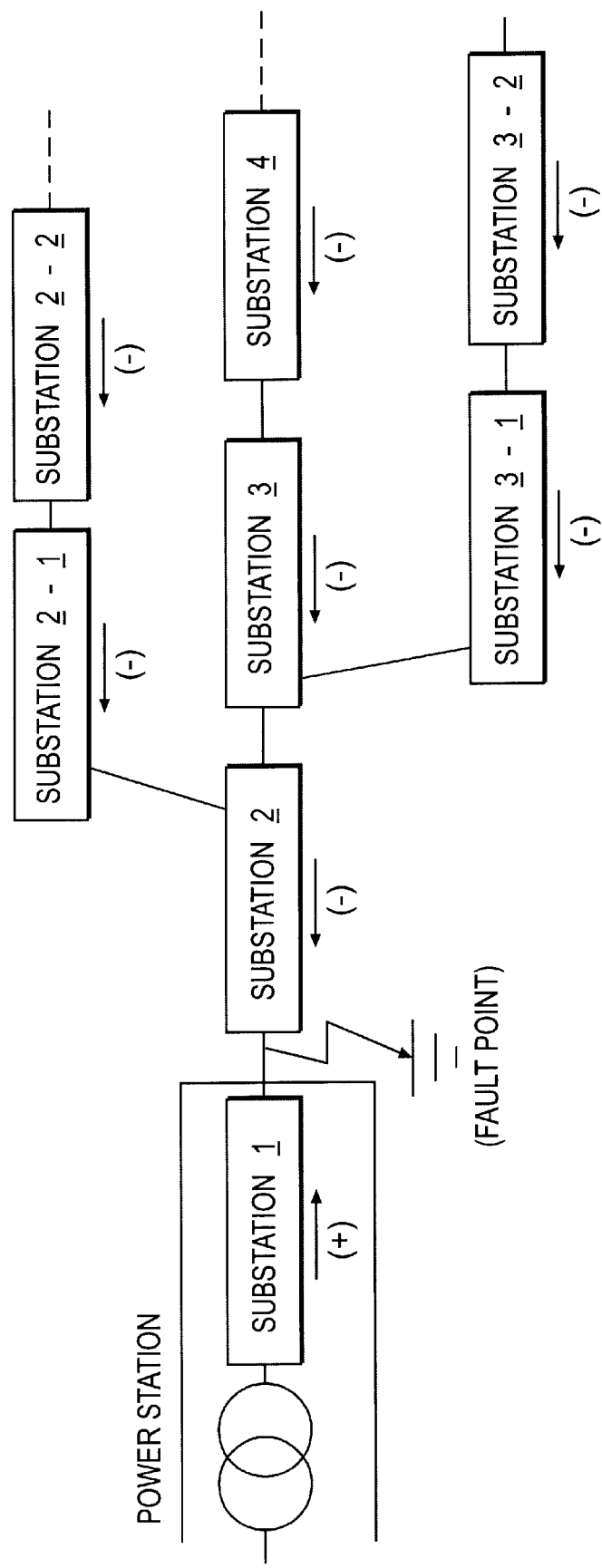
FIG. 10 is an explanatory view showing polarities of each substation in the case of a fault present along a TD line with branches.

Explaining faults specifically with reference to FIG. 10, if there is a fault location between substations ① and ② on a trunk line with no branch, the substation ① has a polarity opposite to that of the substation ②. Therefore, the section between the substations ① and ② is determined to be a fault section.

Figure 11:
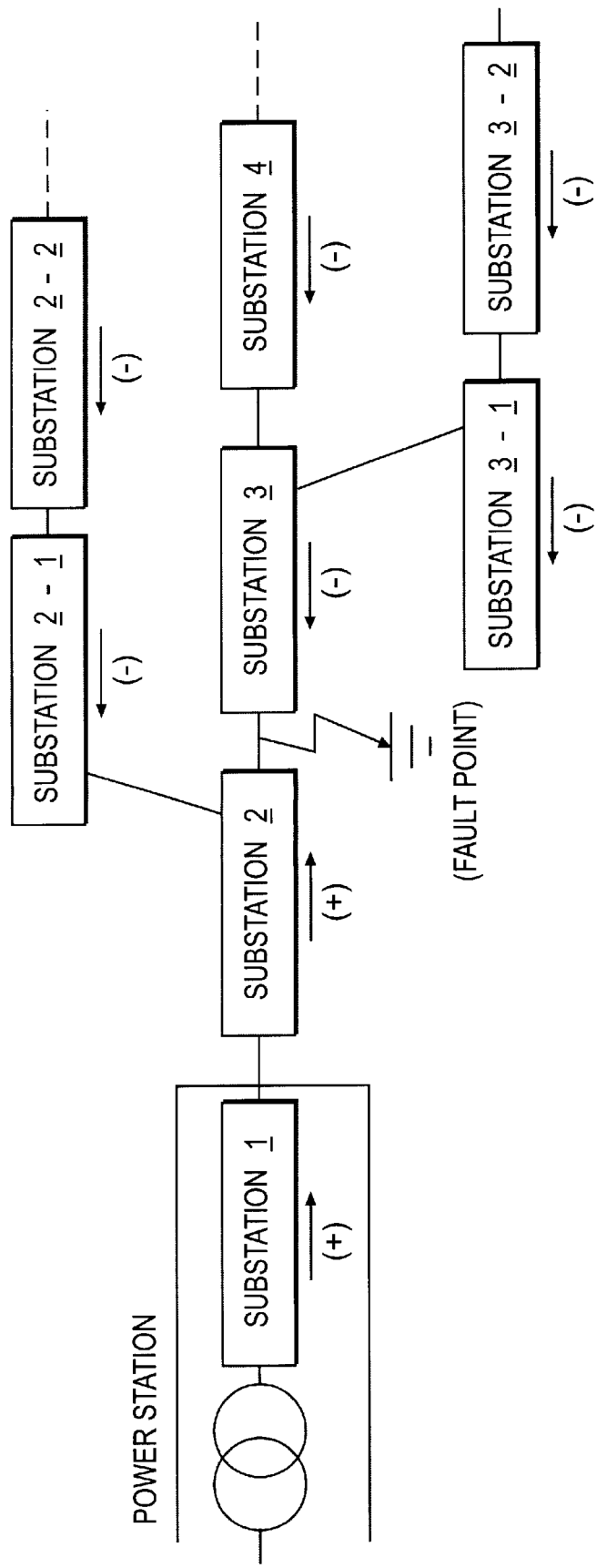
FIG. 11 is an explanatory view showing polarities of each substation in the case of a fault present along a TD line with branches.

Moreover, as shown in FIG. 11, if there is a fault location between substations ② and ③ on the trunk line (or between substations ② and ②-① of a spur line), the polarity of the substation ② is opposite to that of the substation ③, and the polarity of the substation ② is opposite to that of the substation ②-①. In this case, it is decided that the section ranging from the substation ②-① through the substation ② to the substation ③ is a fault section.

Figure 12:
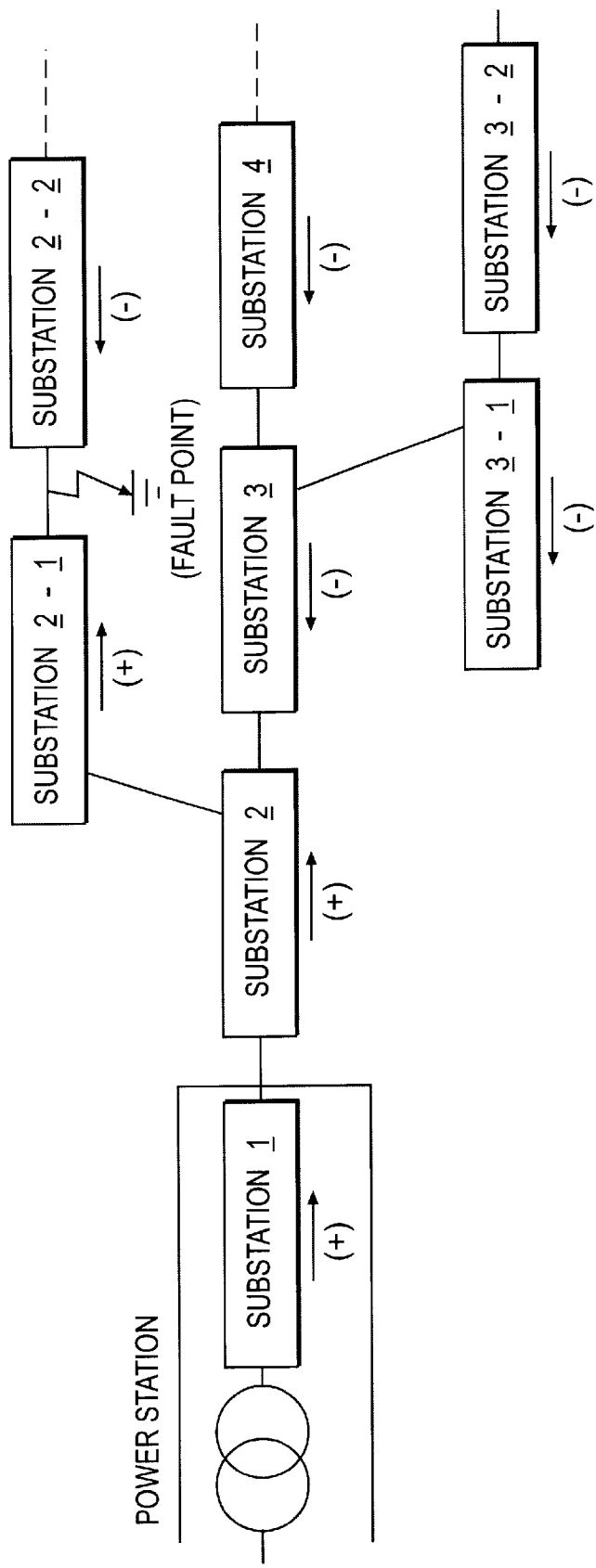
FIG. 12 is an explanatory view showing polarities of each substation in the case of a fault present along a TD line with branches.

As shown in FIG. 12, if there is a fault between substations ②-① and ②-② of a spur line with no branch, the substation ②-① has a polarity opposite to that of the substation ②-②. Therefore, the section ranging from the substation ②-① to the substation ②-② is decided to be a fault section.

In any of these patterns, the foregoing procedures allow a fault section to be located.

(II) Locating a Fault Point

The master station 2 sectionalizes a fault section by the fault section locating processing mentioned above and then automatically identifies at which point the fault has occurred within the fault section.

Here, the principle of locating a fault point will first be explained and then its procedures will be explained.

i) Principle of Locating a Fault Point

Figure 13:
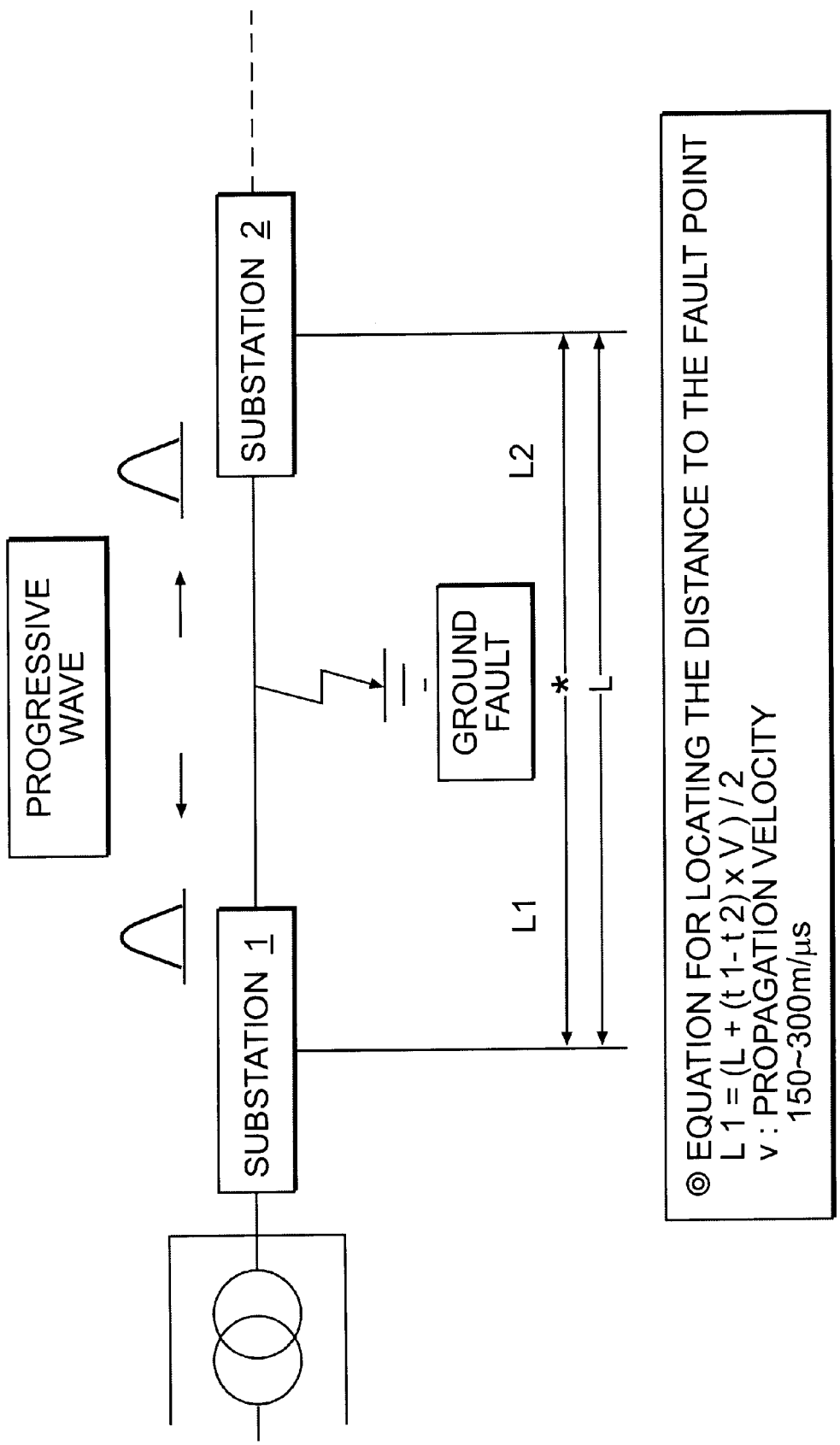
FIG. 13 is an explanatory view showing the principle for identifying a fault point in a section with no branch.

FIG. 13 shows the principle of locating a fault point.

Occurrence of a ground fault within the section between substations ① and ② causes a progressive wave (a surge) to develop as shown in FIG. 13. The duration of time required for detecting this progressive wave at substations ① and ② is proportional to distance L1 and L2 from the point of occurrence of the fault to each substation assuming that the propagation velocity v of the progressive wave traveling along the TD line is constant.

That is, if the distance L between substations ① and ② is known and a difference in the duration of time detected at substations ① and ② is accurately detected, the equation "L1=(L+(t1−t2)×v)/2", shown in FIG. 13, allows for determining the distance L1 from the substation ① to the fault point.

The distance L of the TD line between substations ① and ② can be calculated in accordance with the location information (latitude, longitude, and altitude) sent from substations ① and ② assuming that the TD line is practically a straight line.

The procedures for locating a fault point will be explained below.

ii) Procedures for Locating a Fault Point

The central processing unit 23 of the master station 2 identifies a fault section according to the foregoing procedures in 2. b. (I). ii) and then first determines the length L of the TD line of the fault section.

Subsequently, in accordance with surge detection time t1 detected at one of the substations at both ends of the fault section (corresponding to ① and ② in FIG. 13), said surge detection time t2 of the other substation, surge propagation velocity v, and length L of the TD line of the section where said fault has occurred, distance L1 along the TD line from one of the substations to the location of the fault along the TD line is determined by equation L1=(L+(t1−t2)×v)/2.

Where v is 150 to 300 m/μs in consideration of overhead line and cable distribution line cases.

The v is preferably set to 250 to 300 m/μs. In this case, although the time of the substations at both ends must be accurately synchronized for detection of a difference in time, the time at each substation is synchronized by timing the reference clock of each substation with the reference time sent by the GPS satellite as mentioned above.

(III) Displaying the Location of a Fault

The central processing unit 23 of the master station 2 completes locating a fault point and then, to let the operator know the fault point, superimposes the map information shown in FIG. 14, the TD line map information shown in FIG. 15, and the located fault point to re-prepare TD line map information, and then displays this information on the screen of the CRT 241 as shown in FIG. 16. Moreover, the central processing unit 23 allows the printer 242 to perform printing in response to the operator's request.

3. Effects of the Fault Point Location System

The present fault point location system allows a substation to determine the location information thereof (latitude, longitude, and altitude) on the basis of signals from the GPS satellite and then to send the information to the master station; the master station automatically prepares a TD line based on the location information. For this reason, the fault point location system allows a TD line map to be prepared accurately, readily, and quickly.

Furthermore, the present fault point location system allows a TD line map to be updated (modified) in accordance with location information sent by substations regardless of a change in the location of a substation (a steel tower or pole) due to relocation of the steel tower or pole, thus allowing an up-to-date TD line map to be always available. Accordingly, the up-to-date TD line map can be used for displaying the results of locating fault points.

Upon performing fault point location, a substation detects the time at which a surge signal arrives that occurs at the time of a fault and the polarity of the surge signal, and then sends the time and polarity to the master station. On the other hand, the master station sectionalizes a fault section of the line using the polarity of the surge signal and, as well, identifies the distance to the point of the fault (from the substation to the point of the fault) in accordance with the difference in time of arrival of the surge signal (time difference) at substations installed at both ends of said fault section. Therefore, fault points can be located quickly and accurately.

[Another Embodiment]

(1) The configuration of a fault point location system

As shown in FIG. 1, the fault point location system of another embodiment of the present invention comprises;
  substations 1 which are installed at each steel tower or pole along TD lines and
  a master station 2 which is installed at a service office or branch office of a power company, prepares TD line maps on the basis of information from substations 1 for identifying fault sections.

(a) Substations

As shown in FIG. 2, a substation 1 is provided with a GPS antenna 111, a GPS receiver 112, an oscillator 121, reference clock 122, a time synchronization correcting circuit 123, a sensor 131, a filter circuit 132, a surge signal detection circuit 133, a surge detection time holding circuit 134, a surge polarity holding circuit 135, a signal processing circuit 141, a communication interface 142, and a portable telephone 143.

The GPS antenna 111 and the GPS receiver 112 correspond to the "GPS receiving means 11" designated in the summary and claims of the invention. Similarly, the oscillator 121, the reference clock 122, and the time synchronization correcting circuit 123 correspond to the "time measuring means 12".

Likewise, the sensor 131, the filter circuit 132, the surge signal detection circuit 133, the surge detection time holding circuit 134, and the surge polarity holding circuit 135 correspond to the "surge detection means 13". Furthermore in a like manner, the signal processing circuit 141, the communication interface 142, and the portable telephone 143 correspond to the "self-position information transmitting means 14a" and the "surge information transmitting means 14b".

Each component of a substation will be explained below.

i) Sensor 131

The sensor 131 is a ZCT (Zero-phase Current Transformer) mounted on a steel tower of a TD line to detect surge signals (surge current) that occur at the time of a fault and then send them to the filter circuit 132. To detect a surge voltage as a surge signal, a voltage detector such as a PT or PD is used.

ii) Filter Circuit 132

The filter circuit 132 filters signals, which the sensor 131 has detected, to remove unnecessary commercial frequency components except for a surge signal and allows only the surge signal to pass to the surge signal detection circuit 133.

There are provided the same configuration as the embodiment 1 concerning: iii) Surge signal detection circuit 133, iv) Surge detection time holding circuit 134, v) Surge polarity holding-circuit 135, vi) GPS antenna 111 and GPS receiver 112, vii) Time synchronization correcting circuit 123, viii) Reference clock 122, ix) Oscillator 121, x) Signal processing circuit 141, xi) Communication interface 142, and xii) Portable telephone 143.

Substations 1 comprising the foregoing components have their own substation numbers, respectively, as shown in FIG. 7 and FIG. 10 through FIG. 12. Moreover, the substations of the trunk line are given only trunk line numbers in the same manner as in the embodiment 1. Furthermore, each substation along spur lines branching from the trunk line has the substation number along the trunk line where the substation branches from the trunk line, and the spur line number which is numbered so as to increase in sequence from the source side to the load side in the same manner as in the embodiment 1.

In this embodiment, the substation numbers are given to show whether a substation belongs to a TD line of the trunk line or to a TD line of the spur line, and to show the upstream and downstream relationship between substations. However, the method of maintaining the number information is not limited to this embodiment in the same manner as in the previously described embodiment.

b) Master Station

Figure 17:
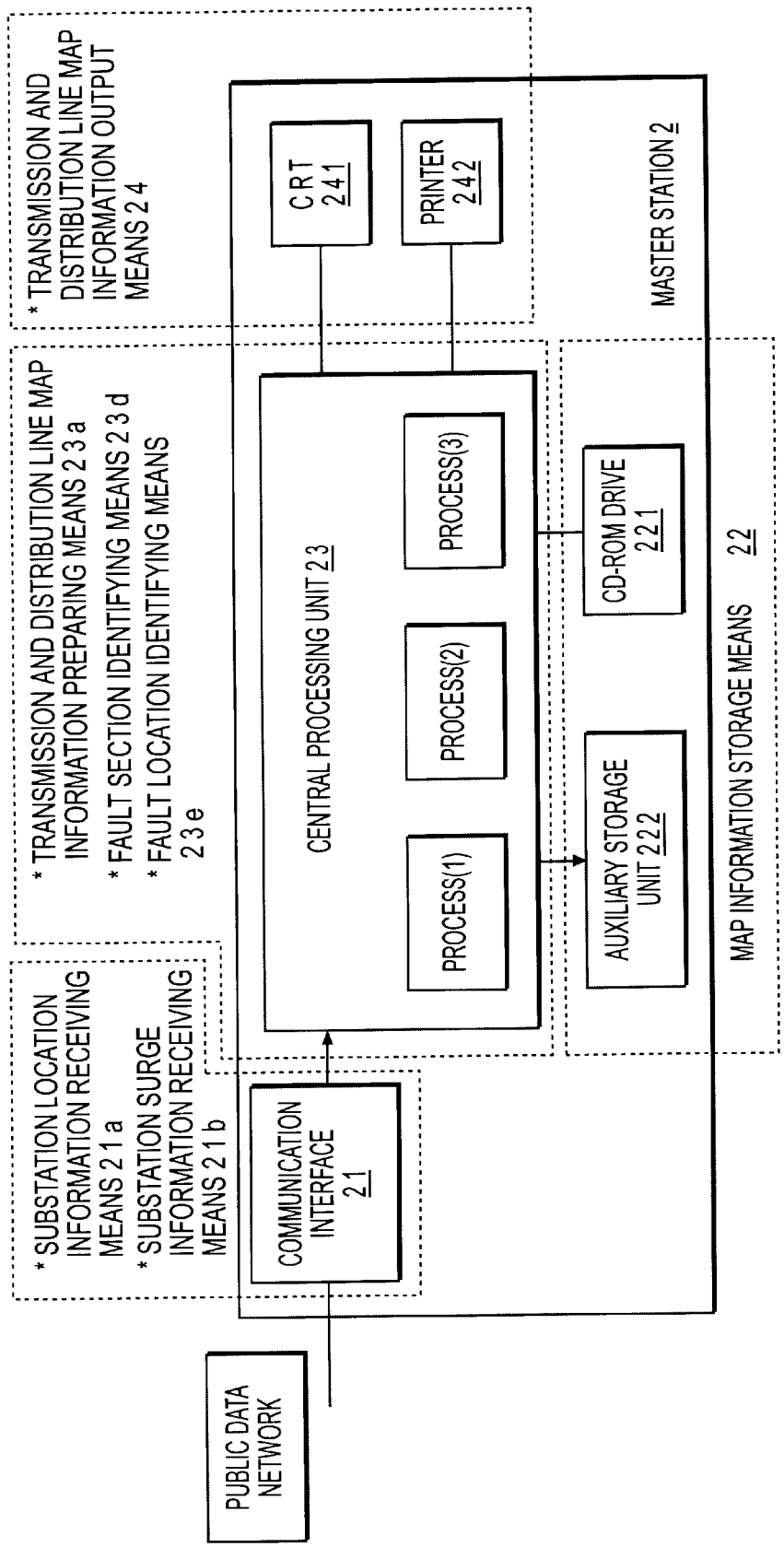
FIG. 17 is an explanatory view showing each component of a master station used in the embodiment 2.

As shown in FIG. 17, a master station 2 comprises a communication interface 21, a CD-ROM drive 221 with a CD-ROM mounted therein, an auxiliary storage unit 222, a central processing unit 23, a CRT 241, and a printer 242. The master station 2 has the same components as those of the previously-described embodiment.

The communication interface 21 corresponds to the "substation location information receiving means 21a" and "substation surge information receiving means 21b" designated in the summary and claims of the invention. Similarly, the CD-ROM mounted in the CD-ROM drive 221 and the auxiliary storage unit 222 correspond to the "map information storage means 22". The central processing unit 23 corresponds to the "TD line map information preparing means 23a", the "fault range confining means 23d", and "fault point potential identifying means 23e". Likewise, the CRT 241 and the printer 242 correspond to the "TD line map information output means 24".

(2) Processing in the Fault Point Location System

The processing in the fault point location system will be explained separately in (a) Preparation of TD line maps, and (b) Locating fault sections.

(a) Preparation of TD Line Maps

The procedures for automatically re-preparing the TD line map data in response to relocation and extension of substations allow a TD line map to be automatically prepared on a virtual sheet on the basis of substation numbers and location information sent by each substation in the same manner as in the previous embodiment.

(b) Locating Fault Sections

In this section, the procedures for identifying the section of a fault in the case of an occurrence of a fault along a TD line will be explained.

As mentioned in the foregoing, upon detecting a surge signal occurring at the time of a fault, the substation 1 automatically sends the polarity of a rise of the surge signal and the time data of detection to the master station 2 as fault information together with the substation number.

At the master station 2, it is determined automatically where the fault occurred on the TD line map on the basis of the fault information sent by each substation 1, 1, 1 . . . The determination is performed through step (I) Locating a fault potential section, and step (II) Locating afault section. Each procedure will be explained below.

(I) Locating a Fault Potential Section

Occurrence of a fault causes the master station 2 to identify a plurality of potential points of a fault within a TD network and to locate fault potential sections in total consideration of a conceivable range of errors based on each potential point.

In this section, i) Principle of locating fault potential points will be explained first, ii) Procedures for locating fault potential points will then be explained, and iii) Procedures for locating fault point potential sections will finally be explained.

i) Principle of Locating Fault Potential Points

FIG. 13 shows the principle of locating a fault point.

Occurrence of a ground fault within the section between substations ① and ② causes a progressive wave (a surge) to develop as shown in FIG. 13. The duration of time required for detecting this progressive wave at substations ① and ② is proportional to distance L1 and L2 from the point of occurrence of the fault to each substation assuming that the propagation velocity v of the progressive wave traveling along the TD line is constant.

That is, if the distance L between substations ① and ② is known and a difference in the duration of time detected at substations ① and ② is accurately detected, the equation "L1=(L+(t1−t2)×v)/2", shown in FIG. 13, allows for determining the distance L1 from the substation ① to the fault point. Where t1 is the time of surge detection at substation ①, and t2 is the time of surge detection at substation ②.

In the fault point location system of the present embodiment, the length L of the TD line between substations (substations at the source end and distal end) at which a difference in the time of surge is to be discussed is calculated and stored in advance.

That is, if two substations are neighboring, the distance between the two substations along the TD line can be calculated on the basis of location information (latitude, longitude, and altitude) sent by the substations assuming that the TD line is practically a straight line.

On the other hand, if two substations are not neighboring, the distance L between the two substations along the TD line can be obtained by adding lengths between neighboring substations present between the two substations.

The procedures for locating fault points will be explained below.

ii) Procedures for Locating Fault Potential Points

The central processing unit 23 of the master station 2 stores in advance length L of the TD line between the neighboring substation nearest to the source-side and a substation at each distal end of the TD line.

Assuming that a fault point exists between the distal end and the source-side end, distance L1 along the TD line from the substation at the source-side end to the location of the fault (potential point) along the TD line can be determined by equation L1=(L+(t1−t2)×v)/2 in accordance with surge detection time t1 detected by the substation at the source-side end out of the substations at both ends (corresponding to ① and ② in FIG. 13), said surge detection time t2 detected by the substation at the distal end, surge propagation velocity v, and length L of the TD line between the two substations.

Where v is 150 to 300 m/μs in consideration of the cases with an overhead line and cable distribution line. The v is preferably set to 250 to 300 m/μs.

In this case, although the time of the substations at both ends must be accurately synchronized for detection of a difference in time, the time at each substation is synchronized by timing the reference clock of each substation with the reference time sent by the GPS satellite as mentioned above.

Performing the foregoing procedures allows for determining L1 or the location of potential points for at least the number of substations at the distal ends of the TD line.

That is, in the case where a TD network has a tree structure and no loop exists along the line, there should exist a fault point between a distal end and source-side end even when a fault point exists somewhere along the TD network; performing the foregoing procedures allows for predicting the location of the fault. In this case, L1's can be determined to be the number that is the same as that of substations at the distal ends discussed.

In the case where a TD network has a loop along the line, although there should exist a plurality of paths along the TD lines from a source-side end to a distal end, creating virtual "distal ends" by the number of conceivable paths allows for treating this case in the same manner as the tree structure. In this case, L1's can be determined to be the number that is the same as that of "virtual substations at the distal ends" discussed.

However, in the fault point location system of the present invention, it is not always necessary to determine potential points for all distal-end or "virtual distal end" substations. Only a practically sufficient number of potential points may be determined.

The plurality of potential points obtained through the foregoing procedures are determined on the basis of an assumption that "the location of an occurrence of a fault exists between a distal end and the source-side end"; the points are not (completely) coincident with actual points except for one point.

Therefore, it is necessary to identify the section of a fault by excluding potential points except for a potential point corresponding to an actual fault point through (II) Locating a fault section, which will be described later.

iii) Procedures for Locating Fault Point Potential Sections

The central processing unit 23 of the master station 2 sectionalizes a certain range of a TD network with each potential point located along the TD network as the center on the basis of conceivable errors.

That is, a section along the TD line is localized within the range of conceivable errors with each potential point as the center. In the case where there exists a branch of a TD line within the section, a section is localized along the TD line of the branch within the range of errors.

Thus, TD networks with all potential points within the range of errors are totally determined as "fault location potential sections".

(II) Locating a Fault Section

The master station 2 identifies fault location potential sections and then confines further the range of faults to localize a fault section according to surge polarity information for each substation. The determination principle will be explained in i) and the procedures in ii) below. An example of locating "a section with no branch" according to surge polarities will be explained in iii) and an example for localizing a fault section will be explained in iv).

i) Principle for Locating a Fault Section

As shown in FIG. 8, when a line-to-ground fault occurs between neighboring substations ② and ③, ground fault surge currents i1 and i2 flow toward the fault location due to the earth stray capacitance of the TD line. Suppose the direction of ground fault surge currents is "+" for a current flowing from the source-side to the load-side and "−" for a current flowing from the load-side to the source-side, and the polarity of the ground fault surge currents becomes "+" at the substation ② and "−" at the substation ③. That is, the substations at both ends of the section with a fault point have mutually opposite polarities.

That is, the rising polarity data of ground fault surge currents are examined among the fault information sent by each substation 1, 1, 1 . . . ; when a substation with the polarity opposite to that of a neighboring substation is found, it can be predicted that there is a fault within a section having the substation and the neighboring substation at both ends of the section.

Based on this principle, a fault section can be identified according to the procedures mentioned below.

ii) Procedures of Locating a Fault Section (Procedure 1) TD lines among substations included within the fault location potential sections determined in the foregoing (I)-iii) and substations that are not included within said fault location potential sections but adjacent to substations included within said fault location potential sections are added to said fault location potential sections into a group of TD lines (hereinafter designated the "extended fault location potential sections"), and selects one predetermined TD line from the group.

"To select one TD line" is defined as to select a series of TD lines with no branch out of TD lines with branches along the lines thereof.

(Procedure 2) Compare the data of a surge rising polarity of a substation with that of its neighboring substation along the TD line selected.

(Procedure 3) If there is no substation of a polarity opposite to that of the neighboring substation thereof, select one predetermined TD line out of said extended fault location potential sections, in which a fault section has not been checked, and then replace said "one TD line selected" with the predetermined TD line to perform from the procedures 2. If there is no TD line, in which a fault section has not been checked, in the extended fault location potential sections, decide that there is no fault section and end the procedures.

(Procedure 4) If there is a substation of a polarity opposite to that of its neighboring substation and the section with these substations located at the ends of the section has no branch, identify the section as a "section with no branch" and, as well, identify the sections which are included both in the identified "section with no branch" and the fault location potential sections as fault sections and then end procedures.

(Procedure 5) If there is a substation of a polarity opposite to that of its neighboring substation and the section with these substations located at the ends of the section has a branch, compare the surge rising polarity data of the most upstream substation (hereinafter designated a "most upstream spur substation") among the substations of the spur TD line with the surge rising polarity data of the upstream substation (hereinafter designated a "trunk section upstream-side substation") among substations which have a polarity opposite to that of their neighboring substation of the trunk TD line (one TD line selected).

(Procedure 6) If polarities of the most upstream spur substation and trunk section upstream-side substation are opposite to each other, identify, as "a section with no branch", the section from most upstream spur substation through the trunk section upstream-side substation to the trunk section downstream-side substation. Then, identify the sections which are included both in the identified "section with no branch" and the fault location potential sections as fault sections and then end procedures.

Here, the "trunk section downstream-side substation" is the station, located downstream, of two neighboring substations with opposite polarities along a trunk TD line.

(Procedure 7) If polarities of the most upstream spur substation and trunk section upstream-side substation are the same, select one TD line from spur TD lines, then replace said "one TD line selected" with said line, and then perform the procedures from the foregoing (Procedure 2).

Through the foregoing procedures, a "section of a fault" is located.

Likewise, the procedures for identifying a section of a fault may be such as shown in the flow diagram of FIG. 9.

iii) Example of Locating a "Section with no Branch"

Figure 18:
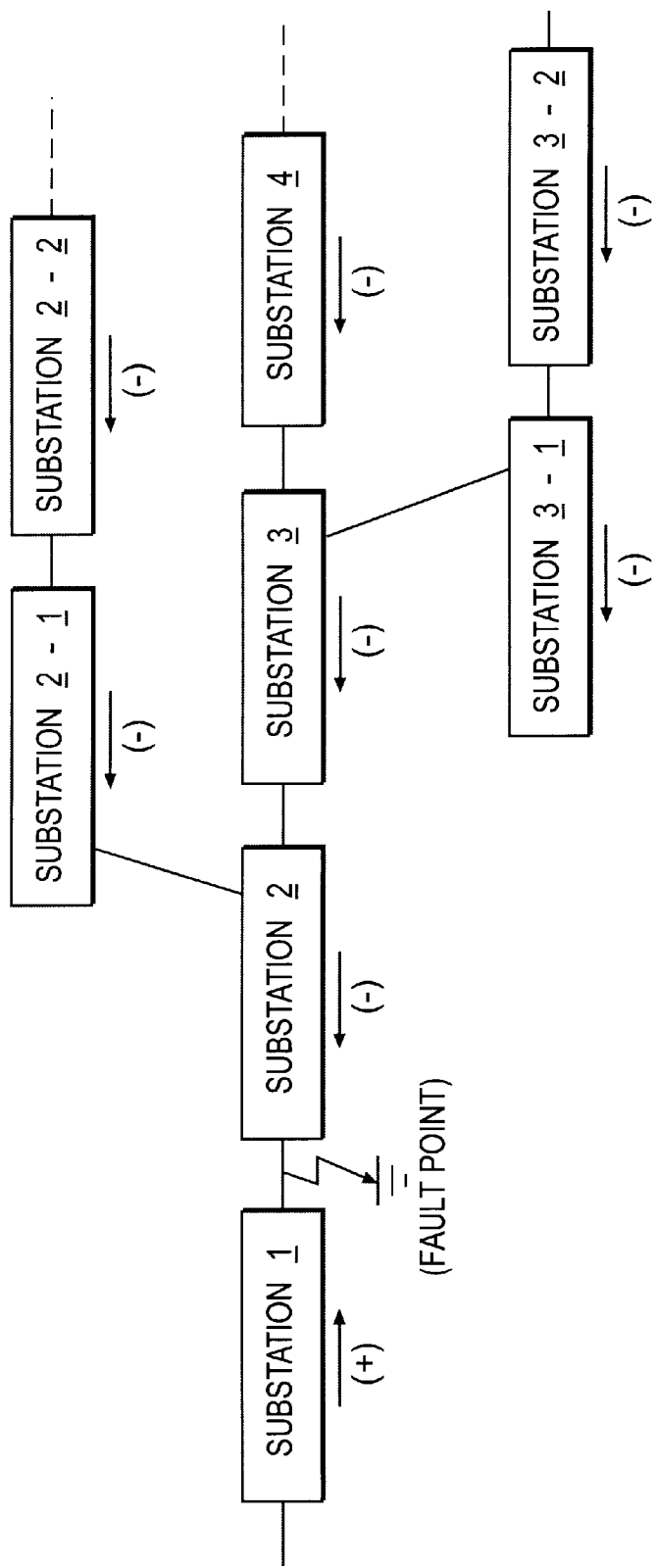
FIG. 18 is an explanatory view showing polarities of each substation in the case of a fault present along a TD line with branches.

The procedures for determining a "section with no branch" in accordance with the polarity of a specific example with reference to FIG. 18 will be explained in this section. If there is a fault point between substations ① and ② with no branch on a "selected one TD line" (hereinafter designated a "trunk line") to be discussed, the substation ① has a polarity opposite to that of the substation ②. Therefore, the section between the substations ① and ② is determined to be a "section with no branch".

Figure 19:
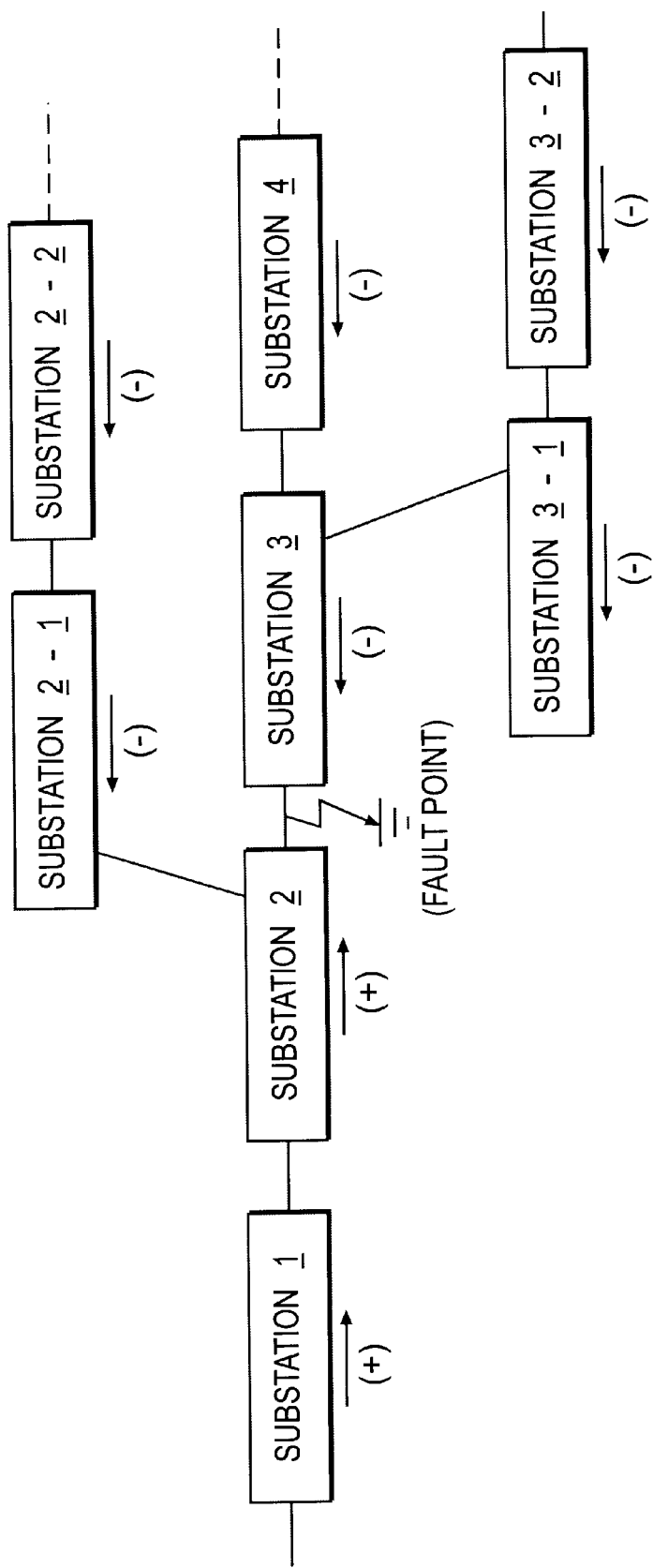
FIG. 19 is an explanatory view showing polarities of each substation in the case of a fault present along a TD line with branches.

Moreover, as shown in FIG. 19, if there is a fault point between substations ② and ③ along the trunk line (or between substations ② and ②-① of a spur line branched from the trunk line) to be discussed, the polarity of the substation ② is opposite to that of the substation ③, and the polarity of the substation ② is opposite to that of the substation ②-①. In this case, it is decided that the section ranging from the substation ②-① through the substation ② to the substation ③ is a "section with no branch".

Figure 20:
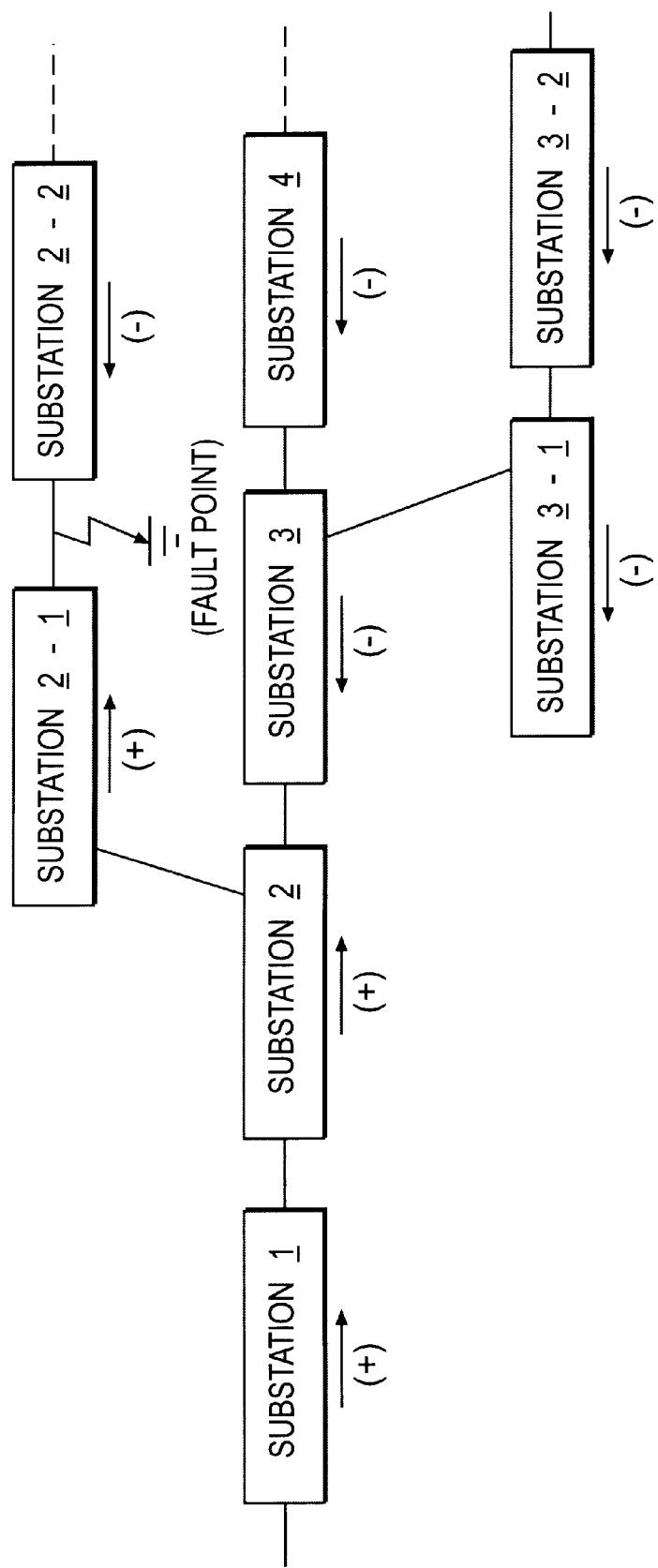
FIG. 20 is an explanatory view showing polarities of each substation in the case of a fault present along a TD line with branches.

As shown in FIG. 20, if there is a fault point between substations ②-① and ②-② of a spur line with no branch, branched from the trunk line to be discussed, the substation ②-① has a polarity opposite to that of the substation ②-②. Therefore, the section ranging from the substation ②-① to the substation ②-② is decided to be a "section with no branch".

In any of these patterns, the foregoing procedures allow a "section with no branch" to be located.

Now, the procedures for identifying fault sections based on fault location potential sections and "sections with no branch" will be specifically explained below.

iv) Example of Identifying Fault Sections

Explanation will be given to the bifurcated TD network with distal substations A and B shown in FIG. 21 through FIG. 23.

Figure 21:
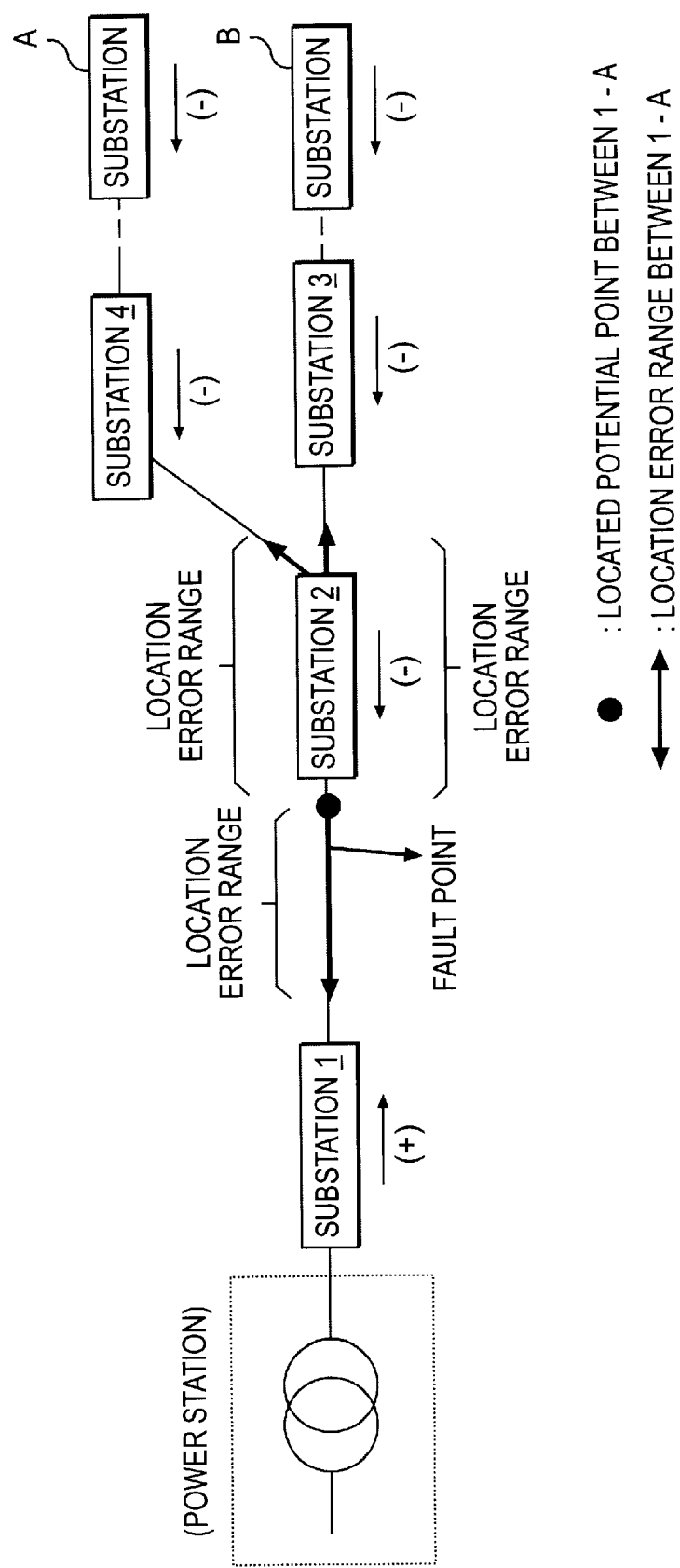
FIG. 21 is an explanatory view showing polarities of each substation in the case of a fault present along a TD line with branches.

First, as shown in FIG. 21, a potential point is localized by said foregoing equation between substation A at a distal end and substation ① at the source-side end and then a location error range is determined on the transmission and distribution network with the potential point as the center.

Figure 22:
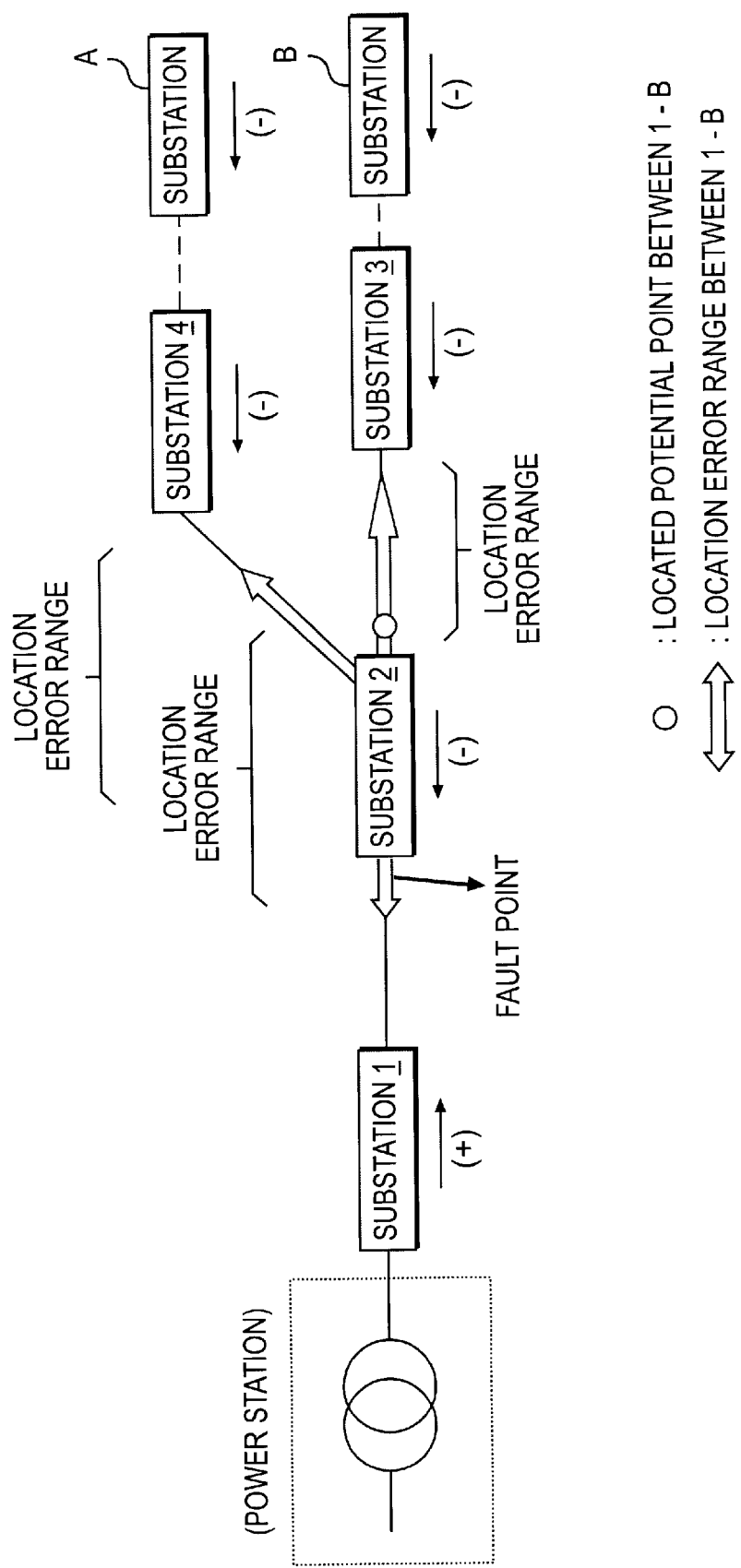
FIG. 22 is an explanatory view showing an identifying method of a fault section in a case where a fault potential point and fault point are located in section "substation ①-substation ②".

Then, as shown in FIG. 22, a potential point is localized between substation B at a distal end and substation ① at the source-side end and then a location error range is determined on the transmission and distribution network with the potential point as the center.

Figure 23:
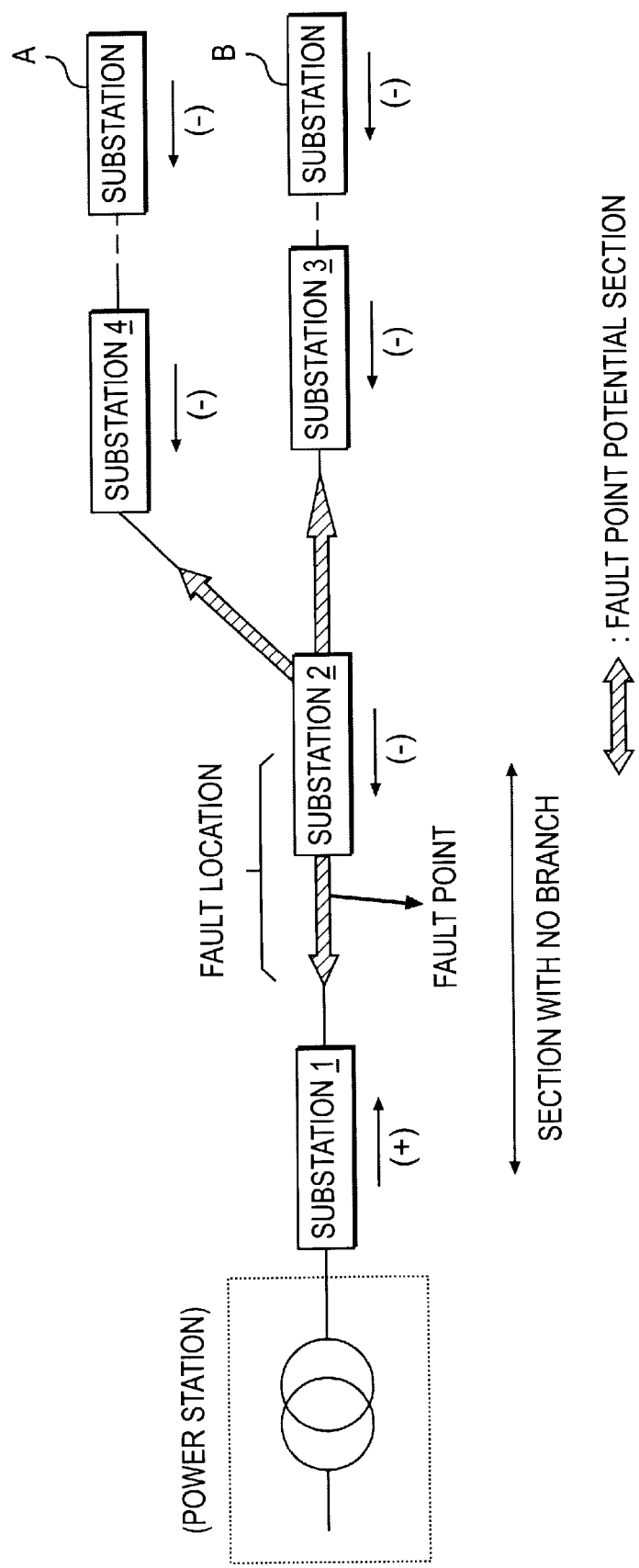
FIG. 23 is an explanatory view showing an identifying method of a fault section in a case where a fault potential point is located in section "substation ②-substation ③" and fault point is located in section "substation ①-substation ②".

Subsequently, as shown in FIG. 23, a "fault point potential section" is determined by totally taking into account sections included within either one of the location error range determined on said "−A" or the location error range determined on said "①−B".

On the other hand, surge polarities of the substations are checked and then section "①−②" where polarities of substations at both ends are opposite to each other is determined as said "section with no branch".

Finally, as shown in FIG. 23, sections included both in said "①−②" and "failure point potential sections" determined through said procedures are determined as "fault sections".

(III) Displaying Sections of an Occurrence of a Fault

Figure 24:
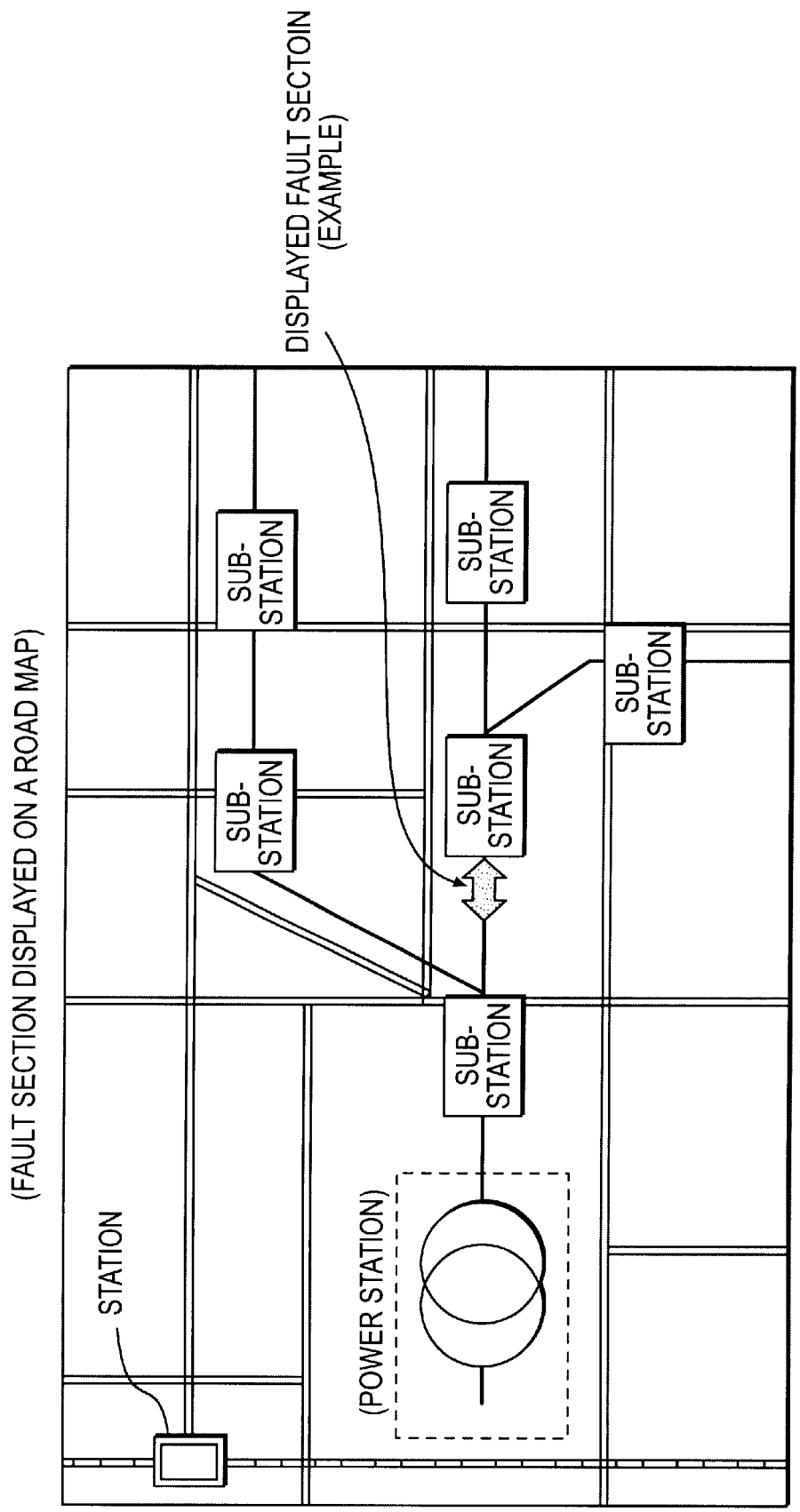
FIG. 24 is an explanatory view showing a screen for displaying a TD line map information which is re-prepared considering map information and information on fault points.

The central processing unit 23 of the master station 2 completes locating a fault section and then, to let the operator know the fault section, superimposes the map information shown in FIG. 14, the TD line map information shown in FIG. 15, and the located fault section to re-prepare TD line map information, and then displays this information on the screen of the CRT 241 as shown in FIG. 24. Moreover, the central processing unit 23 allows the printer 242 to perform printing in response to the operator's request.

(3) Effects of the Fault Point Location System

The present fault point location system allows a substation to detect the time at which a surge signal arrives that occurs at the time of a fault and the polarity of the surge signal, and then send the time and polarity to the master station. On the other hand, the master station predicts the distance to the point of the fault (from the substation to the point of the fault) in accordance with the difference in time of arrival of the surge signal (time difference) at substations installed at the source-side end and at a distal end to identify a fault section.

Therefore, fault sections can be located quickly and accurately. The present fault point location system is effectively available, especially, when the practical application of a calculated fault point (distance L1 from source-side end) may result in a large error in location (distance).

Such a method as to compare polarities of substations from the beginning to localize fault sections may be conceivable. However, such a method requires, theoretically, a great deal of calculations to such an extent (order) as to compare polarities of all neighboring substations concerned.

However, the present fault point location system performs calculations only with the greatest number of distal substations, with the source-side end, to localize fault point potential sections, then comparing polarities of substations within the sections (more precisely only within "extended fault point potential sections") for locating fault sections. Therefore, a reduced amount of calculations for locating fault sections are required when compared with the case of comparisons of polarities of all substations concerned.

Furthermore, the present fault point location system identifies sections that are included in "sections with no branch" and fault point potential sections as fault sections, so that fault sections can be located by referring to a reduced range compared with the method of locating fault sections by comparing polarity of each substation from the beginning.

That is, only locating "fault point potential sections" based on errors requires maintenance personnel to search for fault points in a wider range on the spot.

However, the present fault point location system confines fault sections with sections having neighboring substations with opposite surge polarities, requiring no need of searching for fault points in a wider range on the spot.

In the present fault point location system, the confining operation based on "fault point potential sections" is performed only when there is a substation within "fault point potential sections".

[Other]

It is to be understood that the present invention includes, but is not limited to, said respective embodiment and may be modified or varied according to objects and applications within the scope of the present invention.

That is, information from a substation to the master station may be transmitted either by using wired or wireless public networks such as a portable telephone, PHS, and the public telephone network, or by leased line networks provided along TD lines (such as metal cable, optical fiber, and wireless). TD Still furthermore, map data includes, but is not limited to, those stored either in a CD-ROM, or on other recording media such as a DVD. Alternatively, map data may be downloaded or searched on-line from a server in a WWW site that provides a map information system on the Internet. Such an embodiment allows map data to be downloaded or searched on-line from a server via the Internet eliminating the need to store one's own map information and always allowing for the latest map information available.

What is claimed is:

1. A fault point location system comprising:

substations 1 installed along transmission and distribution lines for sending information along said transmission and distribution lines to a master station 2, and the master station 2 for locating fault points on the basis of the information sent by said substations 1;

wherein said substation 1 has a clock function, receives radio waves from a GPS satellite to identify the current time the GPS has, is able to synchronize the current time said GPS has with the self current time, detects a surge current or surge voltage of the transmission and distribution line along which said substation 1 is installed to identify a surge detection time, the time at which said surge current or surge voltage is detected, recognizes the polarity of said surge current, and then sends said surge detection time and information on said polarity to said master station 2 via a communication network; and said master station 2 receives said surge detection time and information on said polarity, which are transmitted from said substation 1 via the communication network, identifies a section with no branch as the section of occurrence of a fault on the basis of information on said polarity of each substation 1, and identifies the point of occurrence of a fault along the transmission and distribution line on the basis of a difference in the time of detection of said surge detected by substations 1 at both ends of said fault section, and the length of said fault section along the transmission and distribution line, wherein said substation 1 comprises a GPS receiving means 11, a time measuring means 12, a surge detection means 13, and a surge information transmitting means 14b, wherein said GPS receiving means 11 receives GPS radio waves from satellites for identifying the current time the GPS has to send the current time said GPS has to said time measuring means 12, said time measuring means 12 has a clock function for synchronizing the current time said GPS has from said GPS receiving means 11 with the current time of said substation 1 and then sends information on said current time of said substation 1 to the surge detection means 13, said surge detection means 13 detects a surge current or surge voltage of a transmission and distribution line along which said substation 1 is installed, identifies the time of surge detection time at which said surge detection signal is received on the basis of information on the time sent by said time measuring means 12, also recognizes a polarity of said surge current, and transmits said surge detection time and said polarity to said surge information transmitting means 14b, and said surge information transmitting means 14b sends said surge detection time and said information on polarity to said master station 2 via a communication network; and said master station 2 comprising a substation surge information receiving means 21b, a fault section identifying means 23b, and a fault location identifying means 23c, wherein said substation surge information receiving means 21b receives said surge detection time sent by said surge information transmitting means 14b and said information on polarity via a communication network, then sends said information on polarity to said fault section identifying means 23b, and sends said surge detection time to fault location identifying means 23c, said fault section identifying means 23b identifies a section with no branch as a section of occurrence of a fault on the basis of said information on polarity of each substation 1 and sends said section as a fault section to said fault location identifying means 23c, and said fault location identifying means 23c identifies a point of occurrence of a fault along a transmission and distribution line on the basis of a difference in said surge detection time of substations 1 at both ends of said fault section and the length of the transmission and distribution line of said fault section, wherein, in accordance with said surge detection time t1 detected at one of the substations at both ends of said fault section, said surge detection time t2 of the other substation, surge propagation velocity v, and length L of the transmission and distribution line of the section of said fault has occurred, said fault location identifying means determines distance L1 on a transmission and distribution line from one of the substations to the location of the fault along the transmission and distribution line is determined by equation $L1=(L+(t1-t2)\times v)/2$, said fault location identifying means to identify sections of occurrence of a fault through the procedures wherein:

(1) Select one transmission and distribution line that extends from a power source, (2) Compare data of a surge rising polarity of a substation with that of its neighboring substation along said transmission and distribution line selected, (3) If there is a substation of a polarity opposite to its neighboring substation and the section with said substations located at the ends of the section has no branch, decide that the section is "the section with a fault", (4) If there is a substation of a polarity opposite to its neighboring substation and the section with said substations located at the ends of the section has a branch, compare the surge rising polarity data of the most upstream substation among the substations of the spur transmission and distribution line with the surge rising polarity data of the upstream substation among substations which have a polarity opposite to their neighboring substation of the trunk transmission and distribution line, (5) If the polarity of the most upstream substation among the substations of said spur transmission and distribution line is opposite to the polarity of the upstream substation among substations which have a polarity opposite to their neighboring substation of said trunk transmission and distribution line, decide that the section ranging from the most upstream substation among the substations of said spur transmission and distribution line through the upstream substation among substations which have a polarity opposite to their neighboring substation of said trunk transmission and distribution line to the downstream substation among substations which have a polarity opposite to their neighboring substation of said trunk transmission and distribution line is a "section of a fault", (6) If the polarity of the most upstream substation among the substations of said spur transmission and distribution line is the same as the polarity of the upstream substation among substations which have a polarity opposite to their neighboring substation of said trunk transmission and distribution line, select one transmission and distribution line out of said spur transmission and distribution lines to replace said "one transmission and distribution line selected" with the transmission and distribution line out of said spur transmission and distribution lines and perform the procedures from the foregoing 2.

2. A fault point location system comprising;

substations 1 which are installed along a transmission and distribution line to transmit information on said transmission and distribution line to a master station 1, and a master station 2 which prepares information along transmission and distribution lines on the basis of information from said substations 1 to locate faults; said fault point location system characterized in that said substation 1 receives GPS radio waves from a satellite for identifying its own position on the basis of said GPS radio waves and then transmits information on said own position to said master station 2 via communication networks, further, said master station 2 receives the information on the position of said substation 1 sent by said substation 1 via communication networks for preparing transmission and distribution line map information which has transmission and distribution lines illustrated on a map on the basis of map information on a region where each substation is installed and information on the position of said substations, and then outputs said transmission and distribution line map information, said substation 1 has a clock function, receives radio waves from a GPS satellite to identify the current time of the GPS, is able to synchronize the current time of said GPS with the self current time, detects a surge current or surge voltage of the transmission and distribution line along which said substation 1 is installed to identify a surge detection time, the time at which said surge current or surge voltage is detected, recognizes the polarity of said surge current, and then sends said surge detection time and information on said polarity to said master station 2 via a communication network, and said master station 2 receives said surge detection time and information on said polarity, which are transmitted from said substation 1 via the communication network, identifies a section with no branch as the section of an occurrence of a fault on the basis of information on said polarity of each substation 1, identifies the point of an occurrence of a fault along the transmission and distribution line on the basis of a difference in the time of detection of said surge detected by substations 1 at both ends of said fault section, and the length of said fault section along the transmission and distribution line, identifies said point of occurrence of a fault along the transmission and distribution line on a transmission and distribution line of said transmission and distribution line map information, re-prepares the transmission and distribution line map information in consideration of said identified information at the point of occurrence of a fault, and outputs said re-prepared transmission and distribution line map information.

3. A fault point location system according to claims 2, wherein, said substation 1 comprises a GPS receiving means 11, a time measuring means 12, a surge detection means 13, a self-position information transmitting means 14a, and a surge information transmitting means 14b;

said master station 2 comprises a substation location information receiving means 21a, a substation surge information receiving means 21b, a map information storage means 22, a transmission and distribution line map information preparing means 23a, a fault section identifying means 23b, a fault location identifying means 23c, and a transmission and distribution line map information output means 24;

said GPS receiving means 11 receives GPS radio waves from a satellite for identifying its own position on the basis of said GPS radio waves and then transmits information on said own position to said self-position information transmitting means 14a;

said self-position information transmitting means 14a transmits information on said own position to said master station 2 via communication networks;

said substation location information receiving means 21a receives the information on the position of said substation 1 sent by said self-position information transmitting means 14a via communication networks to transmit the information on the position of said substation 1 to said transmission and distribution line map information preparing means 23a;

said map information storage means 22 is able to provide map information on a region where each substation is installed for said transmission and distribution line map information preparing means 23a;

said transmission and distribution line map information preparing means 23a receives said map information from said map information storage means 22 for preparing transmission and distribution line map information which has transmission and distribution lines illustrated on a map on the basis of said map information and the information on the position of said substations which was received from said substation location information receiving means 21a to transmit said transmission and distribution line map information to said transmission and distribution line map information output means 24;

said transmission and distribution line map information output means 24 outputs said transmission and distribution line map information;

further, said GPS receiving means 11 receives GPS radio waves from a satellite to identify the current time of the GPS and transmits said current time of the GPS to said time measuring means 12;

said time measuring means 12 has a clock function, is able to synchronize the current time said GPS has sent by said GPS receiving means 11 with the self current time, and transmits said self current time information to the surge detection means 13;

said surge detection means 13 detects a surge current or surge voltage of the transmission and distribution line along which said substation 1 is installed to identify a surge detection time, the time at which said surge current or surge voltage signal is received, on the basis of information on the time from said time measuring means 12, recognizes the polarity of said surge current, and then sends said surge detection time and information on said polarity to said surge information transmitting means 14b;

said surge information transmitting means 14b sends said surge detection time and information on said polarity to said master station 2 via a communication network;

said substation surge information receiving means 21b receives said surge detection time and said information on polarity, which are transmitted from said surge information transmitting means 14b, via the communication network, transmits said information on polarity to said fault section identifying means 23b, and transmits said surge detection time to said fault location identifying means 23c;

said fault section identifying means 23b identifies a section with no branch as the section of an occurrence of a fault on the basis of information on said polarity of each substation 1 and transmits said section as a fault section to said fault location identifying means 23c;

said fault location identifying means 23c identifies the point of occurrence of a fault along the transmission and distribution line on the basis of a difference in the time of detection of said surge detected by substations 1 at both ends of said fault section, and the length of said fault section along the transmission and distribution line;

said transmission and distribution line map information preparing means 23a identifies said point of occurrence of a fault along the transmission and distribution line on a transmission and distribution line of said transmission and distribution line map information, re-prepares the transmission and distribution line map information in consideration of said identified information at the point of occurrence of a fault as well, and transmits said re-prepared transmission and distribution line map information to said transmission and distribution line map information output means 24; and said transmission and distribution line map information output means 24 outputs said re-prepared transmission and distribution line map information.

4. A fault point location system according to claims 3, wherein, in accordance with said surge detection time t1 detected at one of the substations at both ends of said fault section, said surge detection time t2 of the other substation, surge propagation velocity v, and length L of the transmission and distribution line of the section of said fault has occurred, said fault location identifying means determines distance L1 on a transmission and distribution line from one of the substations to the location of the fault along the transmission and distribution line is determined by equation $L1=(L+(t1-t2) \times v)/2$.

5. A fault point location system according to claims 4, said fault location identifying means to identify sections of occurrence of a fault through the procedures wherein:

(1) Select one transmission and distribution line that extends from a power source, (2) Compare data of a surge rising polarity of a substation with that of its neighboring substation along said transmission and distribution line selected, (3) If there is a substation of a polarity opposite to its neighboring substation and the section with said substations located at the ends of the section has no branch, decide that the section is "the section with a fault", (4) If there is a substation of a polarity opposite to its neighboring substation and the section with said substations located at the ends of the section has a branch, compare the surge rising polarity data of the most upstream substation among the substations of the spur transmission and distribution line with the surge rising polarity data of the upstream substation among substations which have a polarity opposite to their neighboring substation of the trunk transmission and distribution line, (5) If the polarity of the most upstream substation among the substations of said spur transmission and distribution line is opposite to the polarity of the upstream substation among substations which have a polarity opposite to their neighboring substation of said trunk transmission and distribution line, decide that the section ranging from the most upstream substation among the substations of said spur transmission and distribution line through the upstream substation among substations which have a polarity opposite to their neighboring substation of said trunk transmission and distribution line to the downstream substation among substations which have a polarity opposite to their neighboring substation of said trunk transmission and distribution line is a "section of a fault", (6) If the polarity of the most upstream substation among the substations of said spur transmission and distribution line is the same as the polarity of the upstream substation among substations which have a polarity opposite to their neighboring substation of said trunk transmission and distribution line, select one transmission and distribution line out of said spur transmission and distribution lines to replace said "one transmission and distribution line selected" with the transmission and distribution line out of said spur transmission and distribution lines and perform the procedures from the foregoing 2.

6. A fault point location system according to any one of claims 4 or 5, wherein said surge propagation velocity is 150 to 300 m/μs.

7. A fault point location system comprising:

substations 1 installed along transmission and distribution lines for sending information on said transmission and distribution lines to a master station 2, and the master station 2 for locating fault points on the basis of the information sent by said substations 1;

wherein said substation 1 has a clock function, receives radio waves from a GPS satellite to identify the current time of the GPS, is able to synchronize the current time of said GPS with the self current time, detects a surge current or surge voltage of the transmission and distribution line on which said substation 1 is installed to identify a surge detection time, the time at which said surge current or surge voltage is detected, recognizes the polarity of said surge current, and then sends said surge detection time and information on said polarity to said master station 2 via a communication network; and said master station 2 receives said surge detection time and information on said polarity, which are transmitted from said substation 1 via the communication network, identifies a potential point of an occurrence of a fault along the transmission and distribution line on the basis of a difference in said surge detection time between said substation 1 which is the nearest to the source-side of said transmission and distribution line and a plurality of distal substations 1 of said transmission and distribution line, and the length of the transmission and distribution line between said substations 1 and 1, and totally identifies a predetermined range of a transmission and distribution line with said potential point as a fault point potential section, and identifies a section with no branch as a section of an occurrence of a fault to determine a fault section on the basis of the information on polarities of a substation 1 within said fault point potential section and a substation, which is not included in said fault point potential section, adjacent to the substation 1 which is included in said fault point potential section, wherein said substation 1 comprises a GPS receiving means 11, a time measuring means 12, a surge detection means 13, and a surge information transmitting means 14b, wherein said GPS receiving means 11 receives GPS radio waves from satellites for identifying the current time of the GPS and sends the current time of said GPS to said time measuring means 12, said time measuring means 12 has a clock function for synchronizing the current time of said GPS from said GPS receiving means 11 with the current time of said substation 1 and then sends information on said current time of said substation 1 to the surge detection means 13, said surge detection means 13 detects a surge current or surge voltage of a transmission and distribution line along which said substation 1 is installed, identifies the time of surge detection time at which said surge detection signal is received on the basis of information on the time sent by said time measuring means 12, also recognizes a polarity of said surge current, and transmits said surge detection time and said polarity to said surge information transmitting means 14b, and said surge information transmitting means 14b sends said surge detection time and said information on polarity to said master station 2 via a communication network; and said master station 2 comprises a substation surge information receiving means 21b, a fault point potential identifying means 23e, and a fault range confining means 23d, wherein said substation surge information receiving means 21b receives said surge detection time sent by said surge information transmitting means 14b and said information on polarity via a communication network, then sends said surge detection time to said fault point potential identifying means 23e, and sends said information on polarity to said fault range confining means 23d, said fault point potential identifying means 23e identifies a potential point of occurrence of a fault along the transmission and distribution line on the basis of a difference in said surge detection time between said substation 1 which is the nearest to the source-side end of said transmission and distribution line and a plurality of distal substations 1 of said transmission and distribution line, and the length of the transmission and distribution line between said substations 1 and 1, and totally identifies a predetermined range of a transmission and distribution line with said potential point as a fault point potential section to be transmitted to said fault range confining means 23d, said fault range confining means 23d identifies a section with no branch as a section of an occurrence of a fault to determine a fault section on the basis of the information on polarities of a substation 1 within said fault point potential section and a substation, which is not included in said fault point potential section, adjacent to the substation 1 which is included in said fault point potential section, wherein said fault range confining means:

(1) selects one predetermined transmission and distribution line from a group of transmission and distribution lines among substations included within said fault location potential sections and substations that are not included within said fault location potential sections but adjacent to substations included within said fault location potential sections and are added to said fault location potential sections into a group of transmission and distribution lines;

(2) compares data of a surge rising polarity of a substation with that of its neighboring substation on said transmission and distribution line selected;

(3) selects one predetermined transmission and distribution line from a group of transmission and distribution lines among substations included within said fault location potential sections and substations that are not included within said fault location potential sections but adjacent to substations included within said fault location potential sections and are added to said fault location potential sections into a group of transmission and distribution lines if there is no substation of a polarity opposite to the neighboring substation thereof to be replaced for said "one transmission and distribution line selected" and then performs from the procedure 2, and decides that there is no fault point if there is no transmission and distribution line along which a fault section has not been checked;

(4) if there is a substation of a polarity opposite to that of its neighboring substation and the section with these substations located at the ends of the section has no branch, identifies the section as a fault section;

(5) if there is a substation of a polarity opposite to that of its neighboring substation and the section with these substations located at the ends of the section has a branch, compares the surge rising polarity data of the most upstream substation among the substations of the spur transmission and distribution line with the surge rising polarity data of the upstream substation among substations which have a polarity opposite to that of their neighboring substation of the trunk transmission and distribution line;

(6) if there the polarity of the most upstream substation among the substations of said spur transmission and distribution line is opposite to the polarity of the upstream substation among substations which have a polarity opposite to their neighboring substation of said trunk transmission and distribution line, determines, to be a fault section, the section from the most upstream substation among the substations of said spur transmission and distribution line through the upstream substation among substations which have a polarity opposite to their neighboring substation of said trunk transmission and distribution line to the downstream substation among substations which have a polarity opposite to their neighboring substation of said trunk transmission and distribution line; and (7) if there the polarity of the most upstream substation among the substations of said spur transmission and distribution line is the same as the polarity of the upstream substation among substations which have a polarity opposite to their neighboring substation of said trunk transmission and distribution line, selects one transmission and distribution line from said spur transmission and distribution lines to be replaced for said "one transmission and distribution line selected" and then performs the procedures from the foregoing procedure 2.

* * * * *